US012603022B2

(12) United States Patent
Ji et al.

(10) Patent No.: US 12,603,022 B2
(45) Date of Patent: Apr. 14, 2026

(54) CONNECTING ASSEMBLY AND ELECTRONIC DEVICE INCLUDING THE SAME

(71) Applicant: SAMSUNG ELECTRONICS CO., LTD., Suwon-si (KR)

(72) Inventors: Youngmin Ji, Suwon-si (KR); Ivanov Igor, Suwon-si (KR); Wonho Lee, Suwon-si (KR); Junghyeon Kim, Suwon-si (KR); Sanggon Shin, Suwon-si (KR); Jungyoung Lee, Suwon-si (KR); Yangwook Kim, Suwon-si (KR); Changryong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 831 days.

(21) Appl. No.: 17/873,565

(22) Filed: Jul. 26, 2022

(65) Prior Publication Data

US 2023/0005395 A1    Jan. 5, 2023

Related U.S. Application Data

(63) Continuation of application No. PCT/KR2022/006848, filed on May 13, 2022.

(30) Foreign Application Priority Data

Jul. 5, 2021    (KR) ........................ 10-2021-0087676
Nov. 17, 2021    (KR) ........................ 10-2021-0158212

(51) Int. Cl.
*G09F 9/30*    (2006.01)
*G06F 1/16*    (2006.01)
(Continued)

(52) U.S. Cl.
CPC ............ *G09F 9/301* (2013.01); *G06F 1/1652* (2013.01); *H05K 1/118* (2013.01); *H05K 1/189* (2013.01)

(58) Field of Classification Search
CPC ...... G09F 9/301; G06F 1/1652; G06F 1/1624; G06F 1/1658; H05K 1/118; H05K 1/189;
(Continued)

(56) References Cited

U.S. PATENT DOCUMENTS 6,320,835 B1    11/2001  Kamei
2010/0073890 A1*    3/2010  Miller ................. H04M 1/0277
361/752

(Continued)

FOREIGN PATENT DOCUMENTS

CN    208956094    6/2019
DE    202021102319    6/2021
(Continued)

OTHER PUBLICATIONS

Extended European Search Report dated Jul. 16, 2024 issued in European Patent Application No. 22837809.7.
(Continued)

*Primary Examiner* — Marisol Figueroa
(74) *Attorney, Agent, or Firm* — Nixon & Vanderhye P.C.

(57) ABSTRACT

An electronic device includes: a first housing including a first printed circuit board (PCB) and a second housing including a second printed circuit board (PCB), a flexible display, and a flexible printed circuit board (FPCB) including a first portion, a second portion connected to the first portion and the first PCB and configured to bend relative to the first portion in a first bending direction, a first flexible portion between the first portion and the second portion, a third portion connected to the first portion and the second PCB and configured to bend relative to the first portion in a
(Continued)

second bending direction opposite to the first bending direction, and a second flexible portion between the first portion and the third portion.

17 Claims, 28 Drawing Sheets

(51) Int. Cl.
| | | |
|---|---|---|
| *H05K 1/11* | (2006.01) | |
| *H05K 1/18* | (2006.01) | |
| *H05K 1/189* | (2026.01) | |

(58) Field of Classification Search
CPC ...... H05K 1/0281; H05K 1/147; H05K 1/148; H04M 1/02; H04M 1/0235; H04M 1/0237; H04M 1/0268; H04M 1/0277
See application file for complete search history.

(56) References Cited

U.S. PATENT DOCUMENTS

| | | | | |
|---|---|---|---|---|
| 2012/0314400 A1* | 12/2012 | Bohn | ................... | H04B 1/3833 |
| | | | | 361/679.01 |
| 2013/0058063 A1* | 3/2013 | O'Brien | ................ | G06F 1/1624 |
| | | | | 361/807 |
| 2019/0261519 A1* | 8/2019 | Park | ....................... | G06F 1/1652 |
| 2021/0263558 A1* | 8/2021 | Bie | ........................ | G06F 1/1652 |
| 2023/0077374 A1* | 3/2023 | Yang | ................... | G06F 3/04847 |

FOREIGN PATENT DOCUMENTS

| | | |
|---|---|---|
| DE | 202021102729 | 6/2021 |
| JP | 2000-090656 | 3/2000 |
| JP | 2004-207447 | 7/2004 |
| JP | 2017-111435 | 6/2017 |
| KR | 20-0402957 | 12/2005 |
| KR | 10-2007-0038249 | 4/2007 |
| KR | 10-2008-0017748 | 2/2008 |
| KR | 10-2008-0017861 | 2/2008 |
| KR | 10-2012-0040336 | 4/2012 |
| KR | 10-2018-0006533 | 1/2018 |
| KR | 10-2019-0086305 | 7/2019 |
| KR | 10-2020-0008408 | 1/2020 |
| KR | 10-2020-0100490 | 8/2020 |
| KR | 10-2020-0101201 | 8/2020 |
| KR | 10-2020-0122479 | 10/2020 |
| WO | 2009/139597 | 11/2009 |

OTHER PUBLICATIONS

Search Report dated Aug. 23, 2022 issued in International Patent Application No. PCT/KR2022/006848.

* cited by examiner

1090

A1       A3       A2

1091

1093

1092

• A

1090

1092  1093  1091

A1

A2

• A

A3

CONNECTING ASSEMBLY AND ELECTRONIC DEVICE INCLUDING THE SAME

CROSS-REFERENCE TO RELATED APPLICATIONS

This application is a continuation of International Application No. PCT/KR2022/006848 designating the United States, filed on May 13, 2022, in the Korean Intellectual Property Receiving Office claiming priority to Korean Patent Application No. 10-2021-0087676 filed on Jul. 5, 2021, in the Korean Intellectual Property Office, and to Korean Patent Application No. 10-2021-0158212 filed on Nov. 17, 2021, in the Korean Intellectual Property Office, the disclosures of all of which are incorporated by reference herein in their entireties.

BACKGROUND

1. Field

The disclosure relates to a connecting assembly and an electronic device including the same.

2. Description of Related Art

Electronic devices including flexible displays are being developed. For example, one housing may move relative to another housing such that a screen display area of a display may be expanded or reduced.

SUMMARY

Embodiments of the disclosure provide a connecting assembly for improving the utilization of an arrangement space and an electronic device including the same. For example, in an electronic device in which many components and a connecting component (e.g., a flexible printed circuit board (FPCB)) connecting the components are arranged in a small space, it is possible to reduce or prevent deformation of the connecting component according to repeated shape changes of the electronic device.

According to an example embodiment, an electronic device may comprises: a first housing including a first printed circuit board (PCB), a second housing configured to move relative to the first housing in a first moving direction and a second moving direction opposite the first moving direction and including a second printed circuit board (PCB), a flexible display comprising a display area configured to expand or reduce based on a moving direction of the second housing, and a flexible printed circuit board (FPCB) configured to electrically connect the first PCB and the second PCB and expand or contract based on the moving direction of the second housing, the FPCB including: a first portion having a rigid material, a second portion connected to the first portion and the first PCB, having a rigid material, and configured to bend relative to the first portion in a first bending direction, a first flexible portion between the first portion and the second portion, a third portion connected to the first portion and the second PCB, having a rigid material, and configured to bend relative to the first portion in a second bending direction opposite to the first bending direction, and a second flexible portion between the first portion and the third portion.

According to an example embodiment, a flexible printed circuit board (FPCB) may comprises: a first portion having a rigid material, a second portion connected to the first portion, having a rigid material, and configured to bend relative to the first portion in a first bending direction, a first flexible portion between the first portion and the second portion, a third portion connected to the first portion, having a rigid material, and configured to bend relative to the first portion in a second bending direction opposite to the first bending direction, and a second flexible portion between the first portion and the third portion.

According to various example embodiments, the utilization of a space in an electronic device in which a PCB is arranged may be improved. According to various embodiments, the flexibility and fixed shape of the PCB may be improved. According to various embodiments, the utilization of an area of an electrical path in the PCB may be improved. According to various embodiments, the mass production and confidence of PCBs may be improved. The effects of the PCB and the electronic device including the same according to various example embodiments are not limited to the above-mentioned effects, and other unmentioned effects can be clearly understood from the following description by one of ordinary skill in the art.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
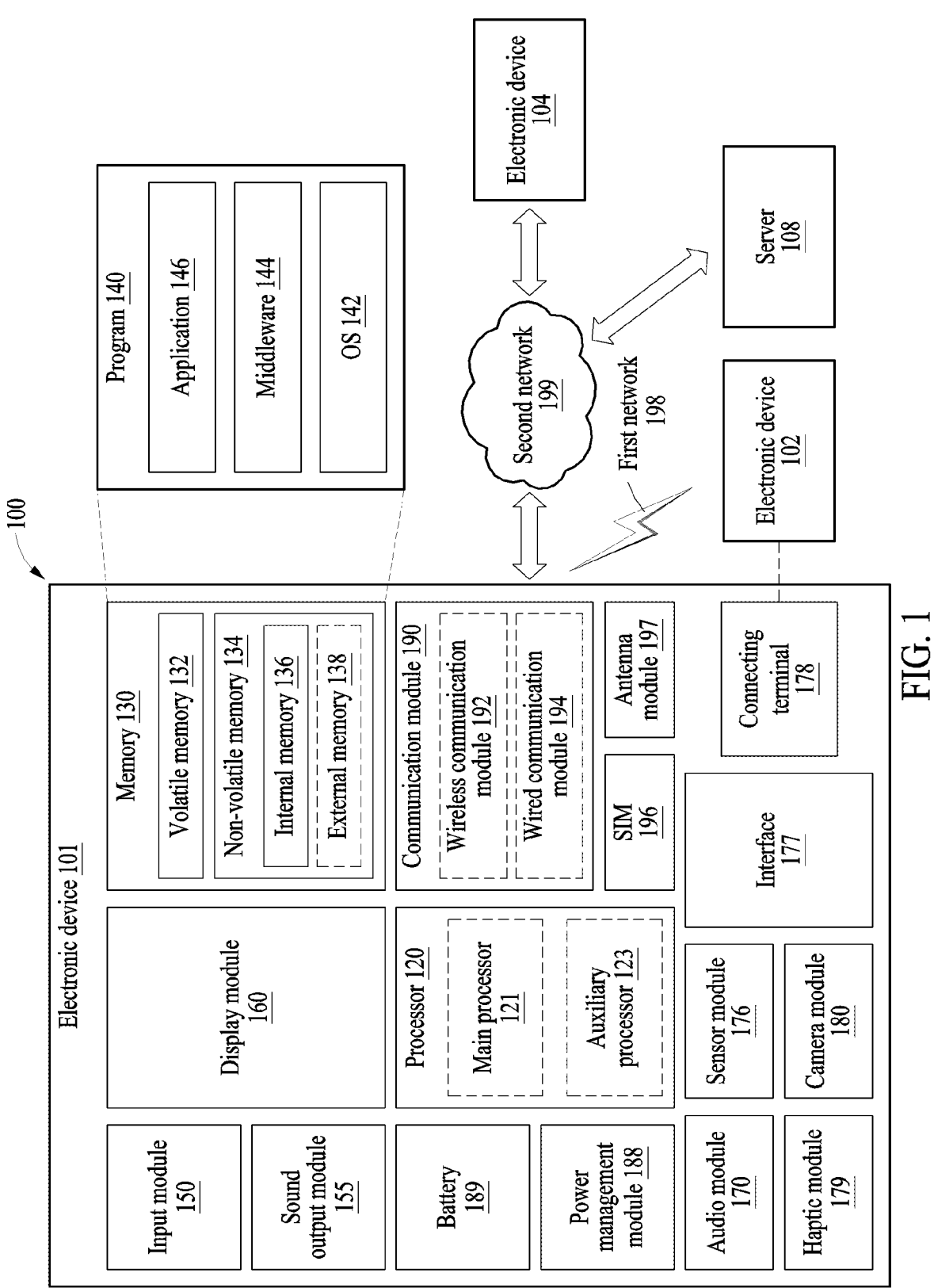
FIG. 1 is a block diagram illustrating an example electronic device in a network environment according to various embodiments.
Figure 2A:
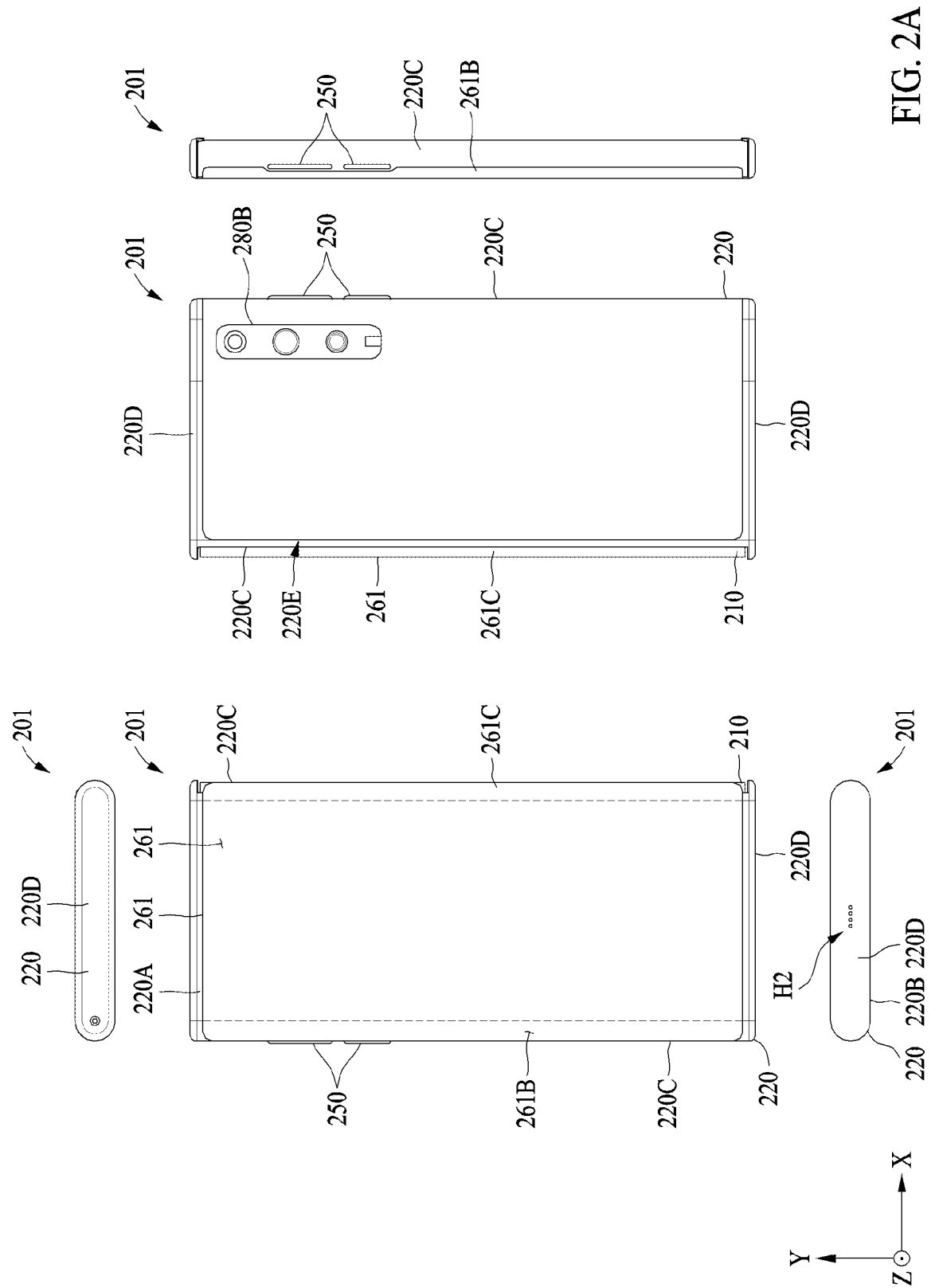
FIG. 2A is a diagram illustrating an example electronic device in a closed state according to various embodiments.
Figure 2B:
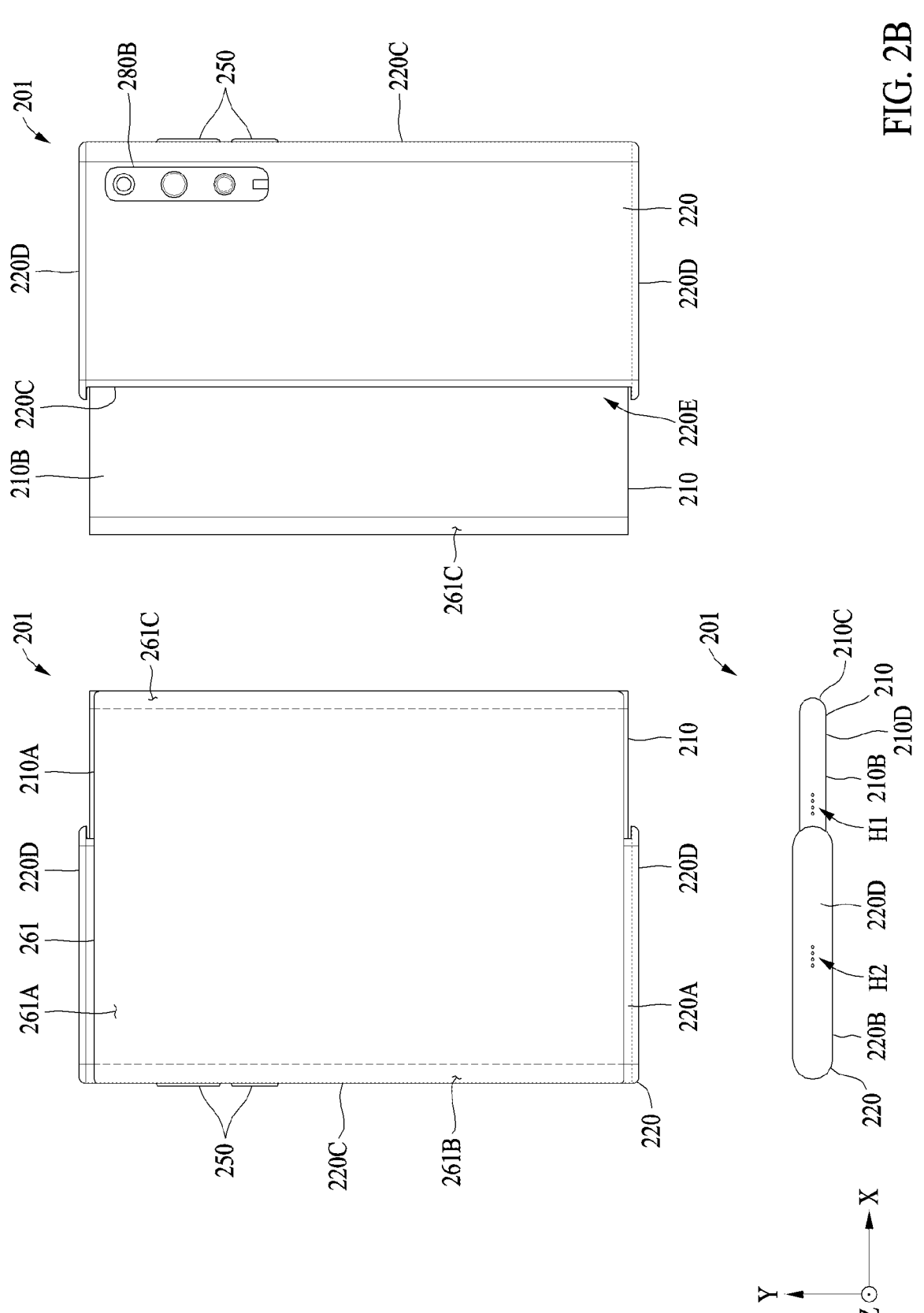
FIG. 2B is a diagram illustrating an example electronic device in an open state according to various embodiments.
Figure 2C:
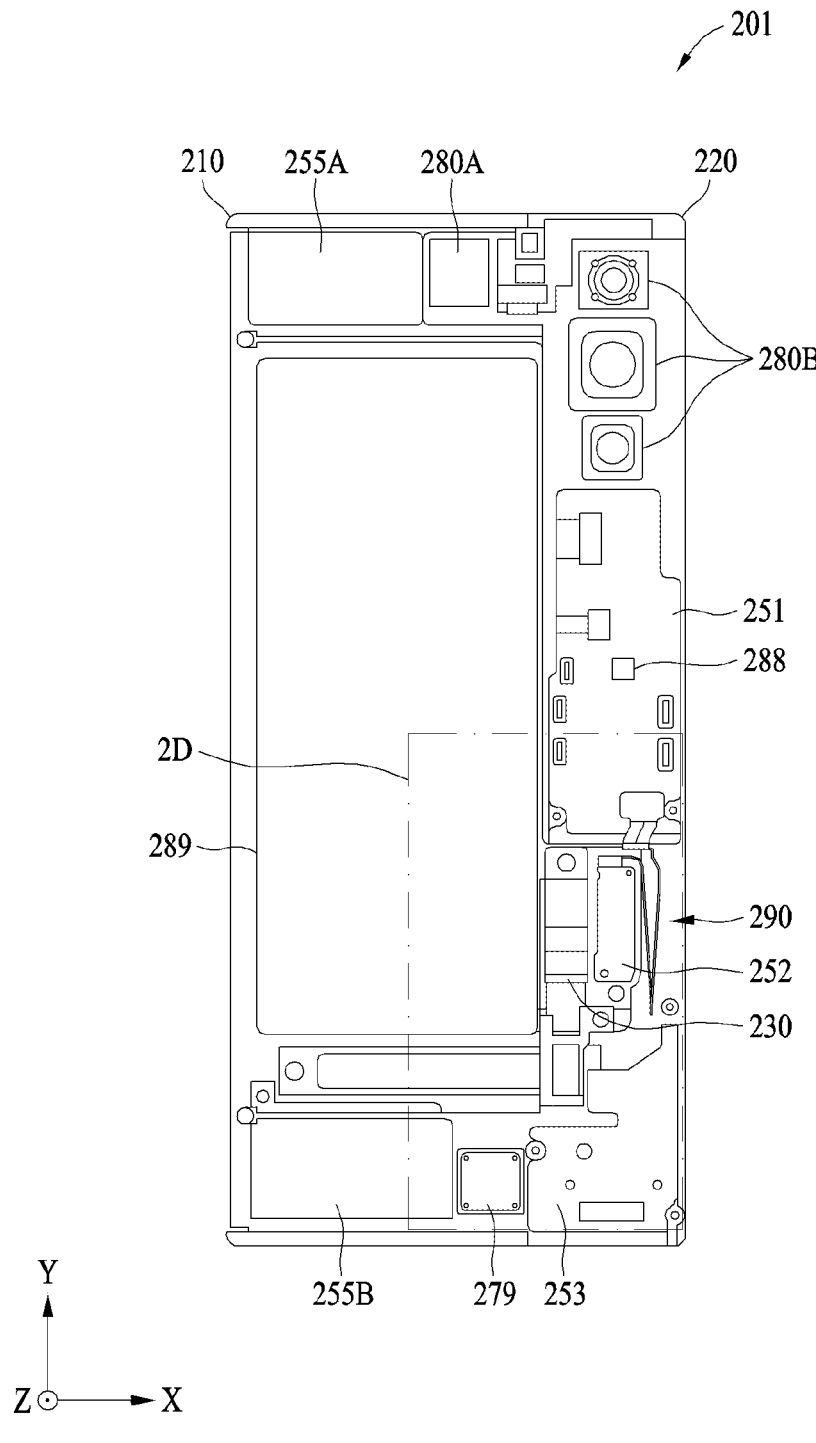
FIG. 2C is a diagram illustrating components in an electronic device in a closed state according to various embodiments.
Figure 2D:
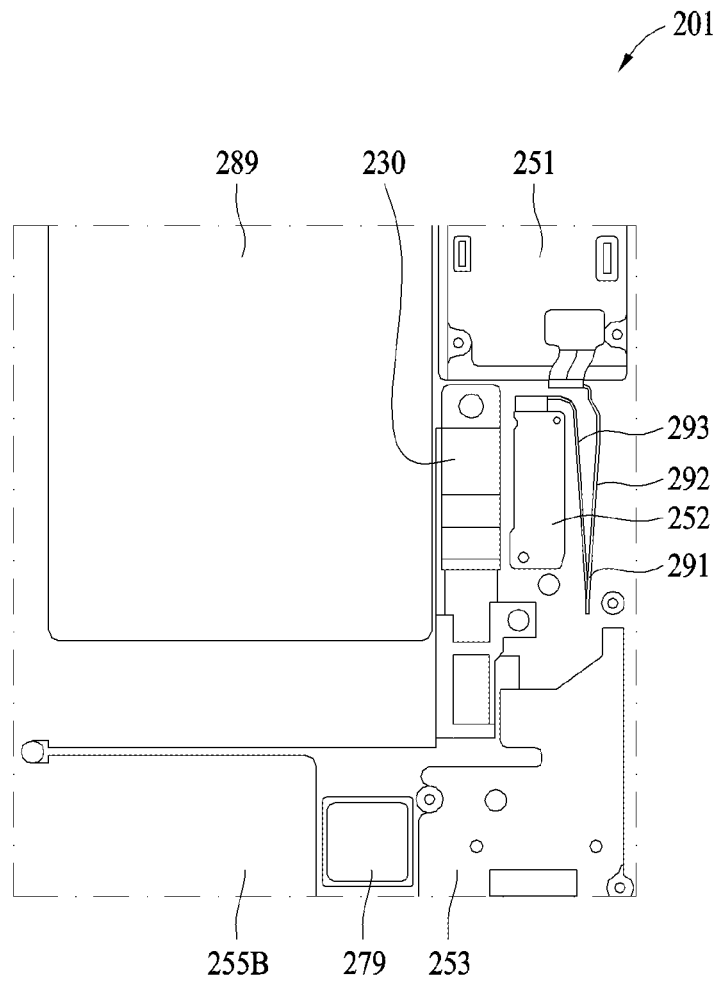
FIG. 2D is a diagram illustrating an enlarged view of a portion 2D of FIG. 2C according to various embodiments.
Figure 2E:
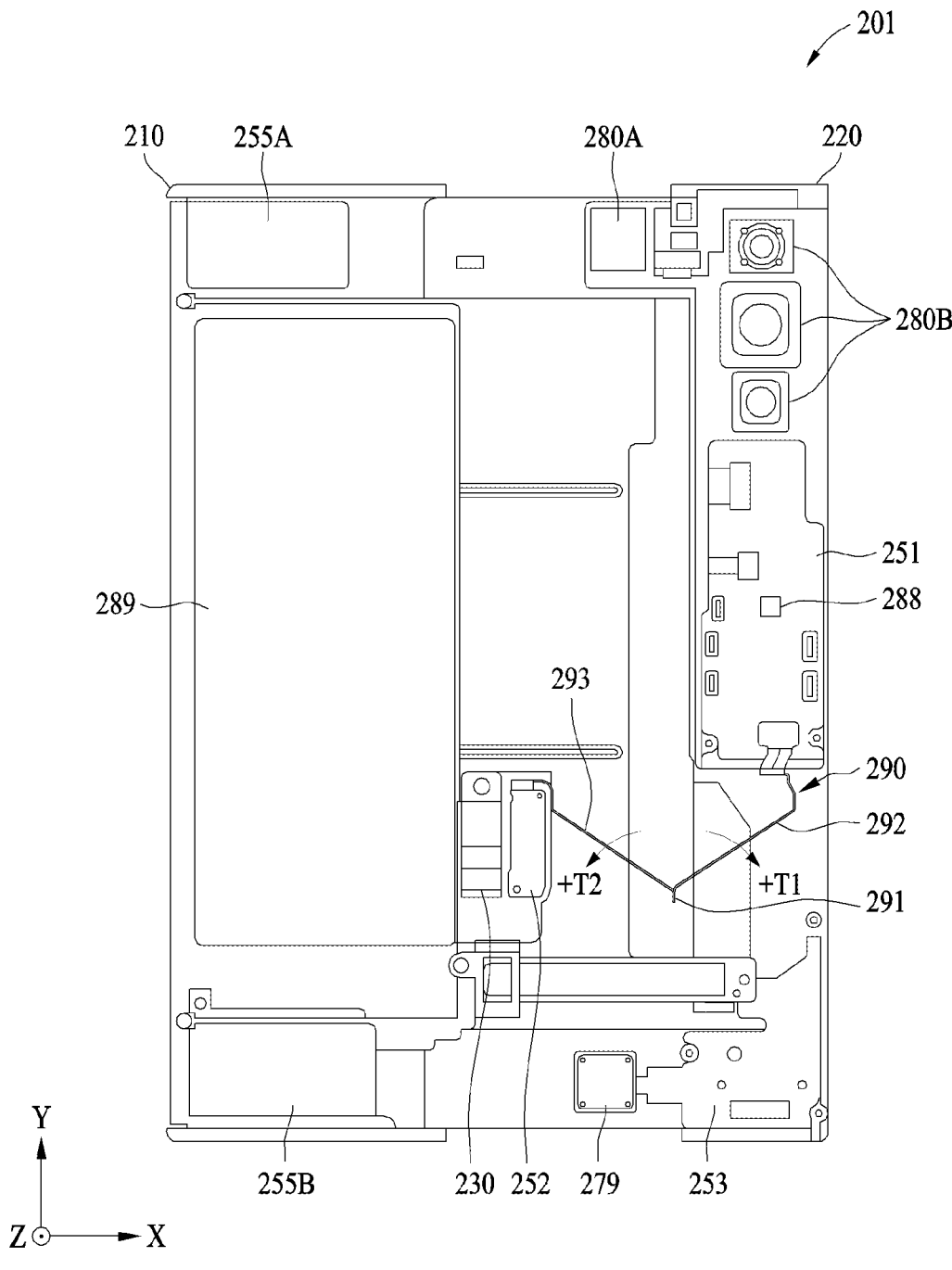
FIG. 2E is a diagram illustrating a view of components in an electronic device in an open state according to various embodiments.
Figure 2F:
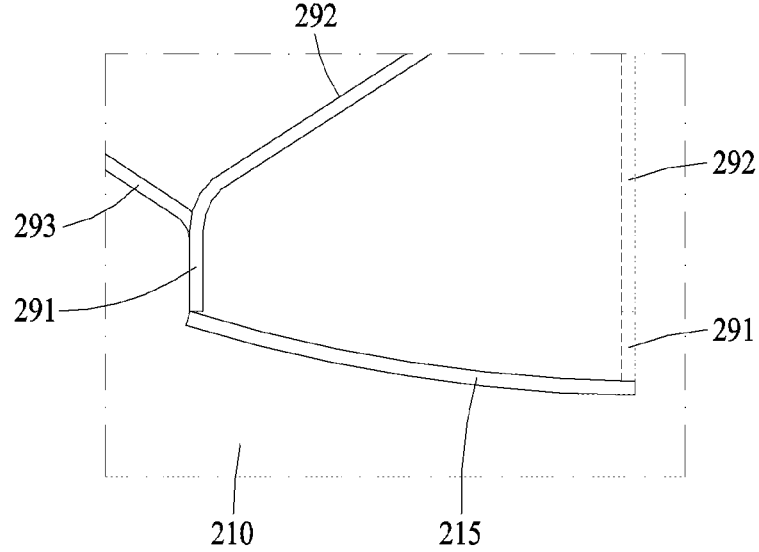
FIG. 2F is a diagram illustrating a guide according to various embodiments.
Figure 2G:
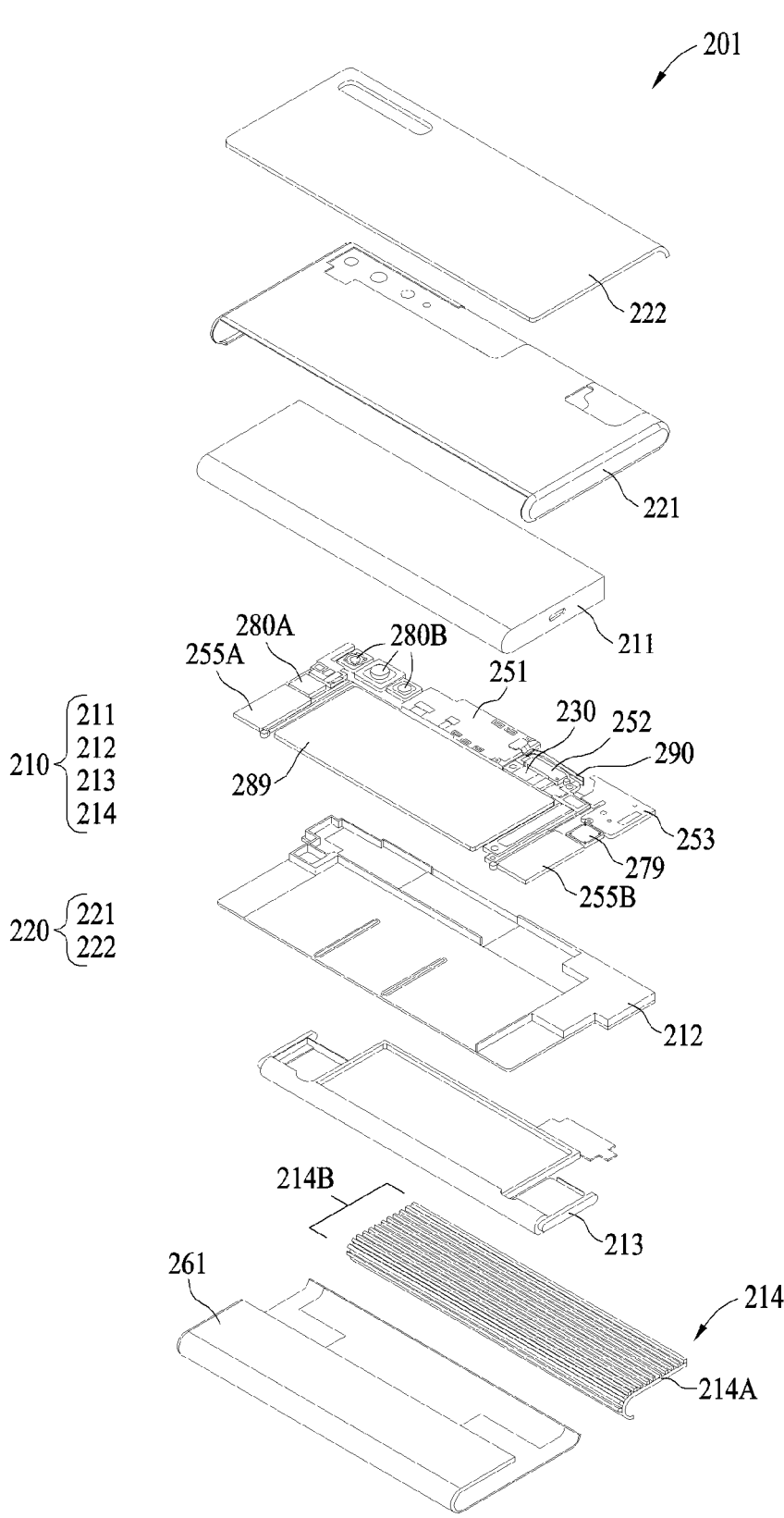
FIG. 2G is an exploded perspective view of an electronic device according to various embodiments.
Figure 3A:
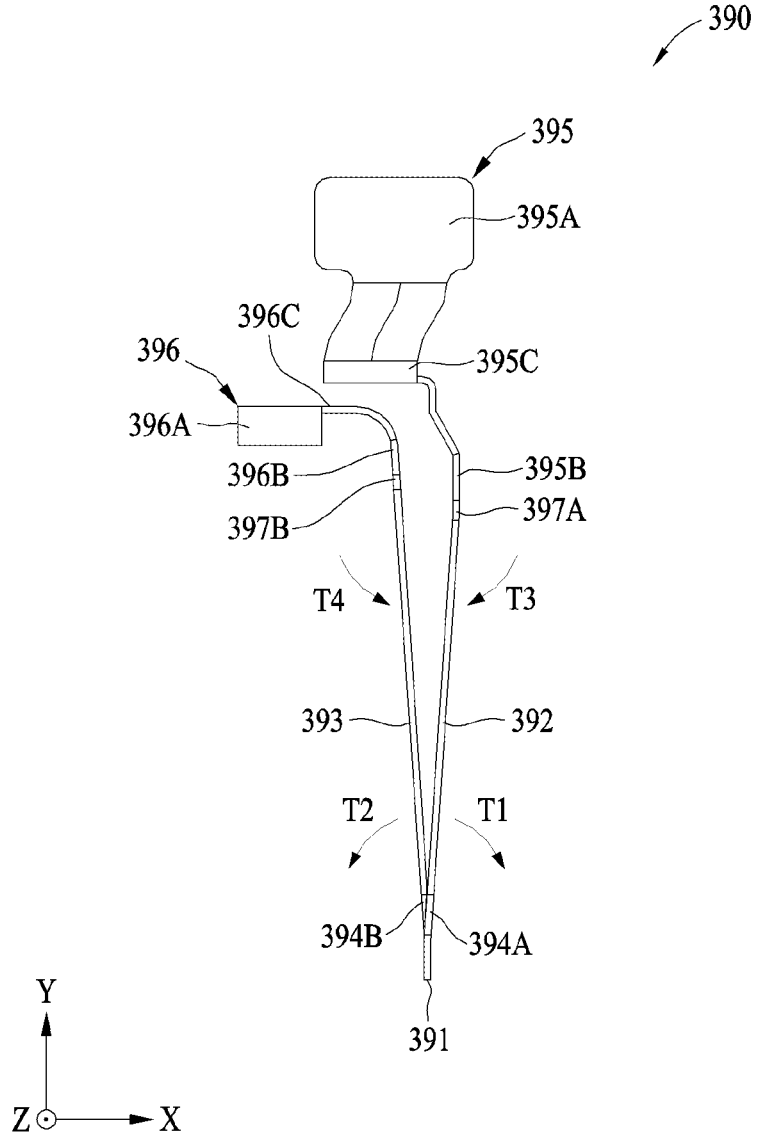
FIG. 3A is a diagram illustrating an example connecting assembly in a first shape, viewed in one direction, according to various embodiments.
Figure 3B:
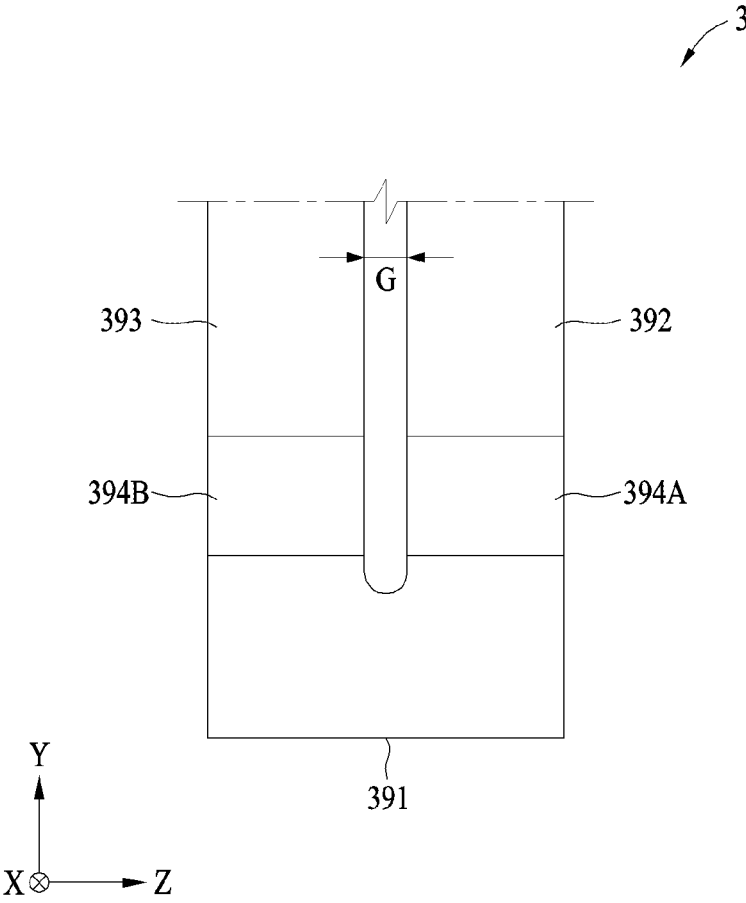
FIG. 3B is a diagram illustrating an example connecting assembly in a first shape, viewed in another direction, according to various embodiments.
Figure 3C:
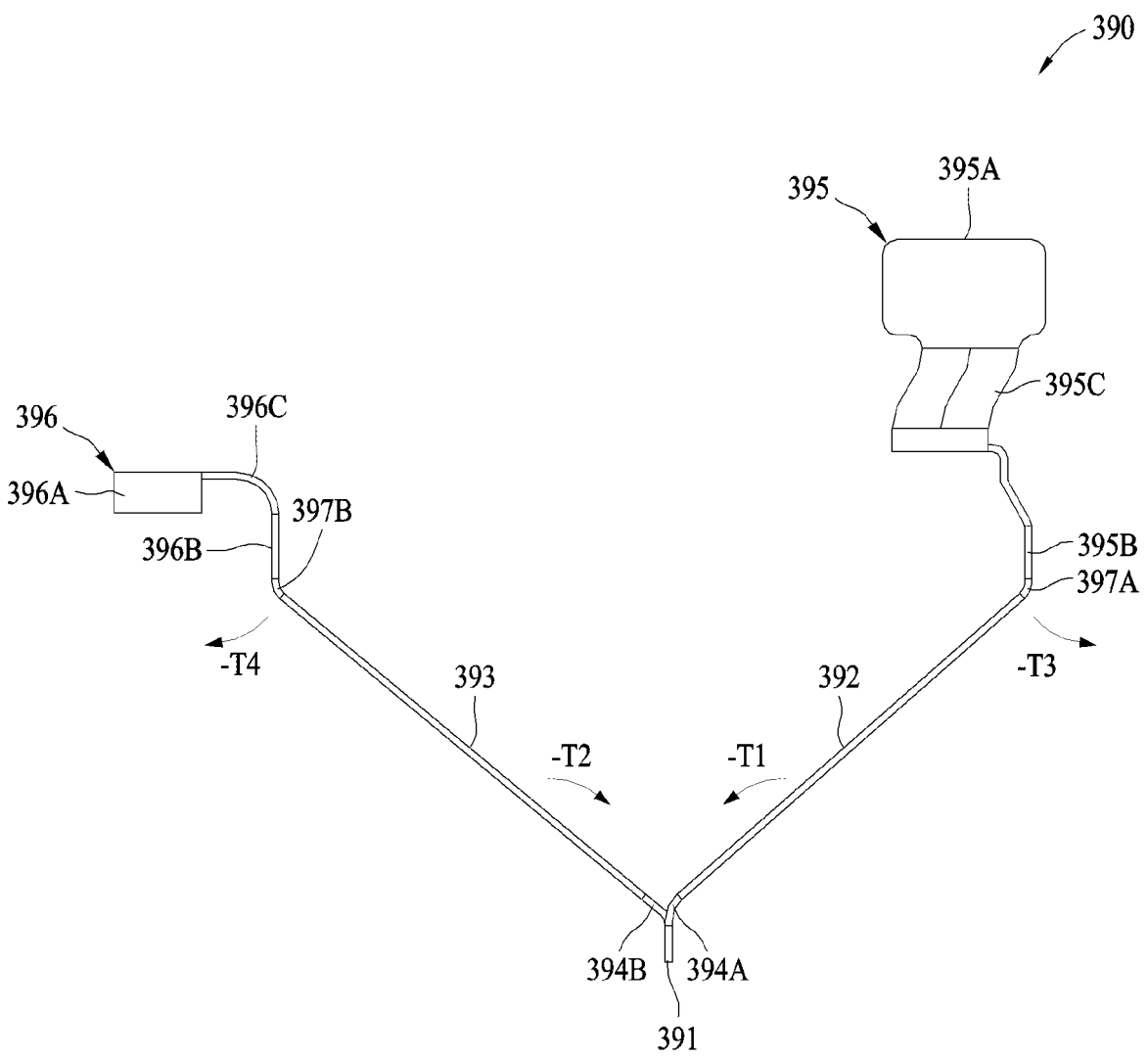
FIG. 3C is a diagram illustrating an example connecting assembly in a second shape, viewed in one direction, according to various embodiments.
Figure 3D:
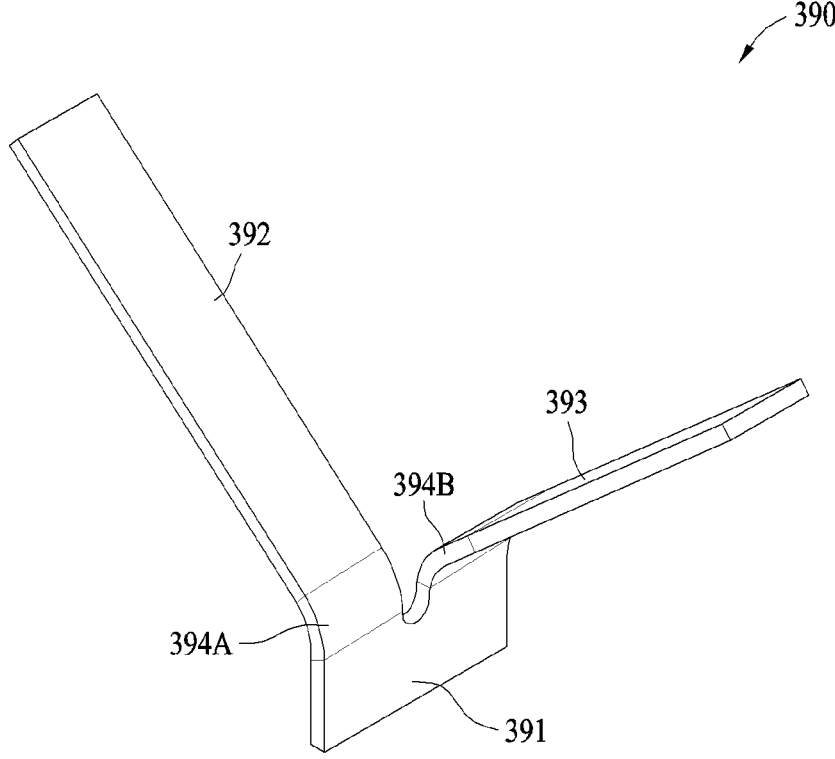
FIG. 3D is a perspective view of a connecting assembly in a second shape according to various embodiments.

Referring to FIG. 1, an electronic device 101 in a network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various example embodiments, at least one (e.g., the connecting terminal 178) of the above components may be omitted from the electronic device 101, or one or more other components may be added in the electronic device 101. In various example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a portion of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module

5

176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a portion of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electrical signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor. In various example embodiments, the sensor module 176 may include a distance sensor configured to detect numerical values (e.g., length, width, and/or area) of the display according to the expansion or reduction of the display.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a portion of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a portion of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least portion of the function or the service. The one or more external electronic devices receiving the request may perform the at least portion of the function or the service requested, or an additional function or an additional service related to the request, and may transfer an outcome of the performing to the electronic device 101. The electronic device 101 may provide the outcome, with or without further processing of the outcome, as at least portion of a reply to the request. To this end, cloud computing, distributed computing, mobile edge computing (MEC), or client-server computing technology may be used, for example. The electronic device 101 may provide ultra low-latency services using, for example, distributed computing or MEC. In an example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smartphone), a computer device, a portable multimedia device, a portable medical device, a camera, a wearable device, a home appliance device, or the like. According to an example embodiment of the disclosure, the electronic device is not limited to those described above.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various example embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Referring to FIGS. 2A, 2B, 2C, 2D and 2E, an electronic device 201 (e.g., the electronic device 101 of FIG. 1) may include a first housing 210 and a second housing 220 that are movably coupled to each other. In an example embodiment, the first housing 210 may be coupled to the second housing 210 to slide relative to the second housing 220. The first housing 210 may be configured to move relative to the second housing 220 in a first moving direction (e.g., a +X direction) or to move relative to the second housing 220 in a second moving direction (e.g., a −X direction) opposite the first moving direction. Meanwhile, various example embodiments of the present disclosure describe that the first housing 210 moves relative to the second housing 220, but are not limited thereto, and it may also be construed that the second housing 220 slides relative to the first housing 210.

The first housing 210 may include a first surface 210A (e.g., a first front surface), a second surface 210B (e.g., a first rear surface) opposite the first surface 210A, a plurality of (e.g., two) first side surfaces 210C (e.g., a first left side surface and a first right side surface) oriented in a first direction (e.g., a +/−X direction) and positioned between the first surface 210A and the second surface 210B, and a plurality of (e.g., two) second side surfaces 210D (e.g., a first upper side surface and a first lower side surface) oriented in a second direction (e.g., a +/−Y direction) intersecting with the first direction and positioned between the first surface 210A and the second surface 210B. In an example embodiment, the plurality of first side surfaces 210C may be formed of rounded surfaces. In an example embodiment, the first housing 210 may include at least one first hole H1 formed on a second side surface 210D (e.g., the first lower side surface) oriented in one direction (e.g., the −Y direction), of the second side surfaces 210D.

The second housing 220 may include a third surface 220A (e.g., a second front surface), a fourth surface 220B (e.g., a second rear surface) opposite the third surface 220A, a plurality of (e.g., two) third side surfaces 220C (e.g., a second left side surface and a second right side surface) oriented in the first direction (e.g., the +/−X direction) and positioned between the third surface 220A and the fourth surface 220B, and a plurality of (e.g., two) fourth side surfaces 220D (e.g., a second upper side surface and a second lower side surface) oriented in the second direction (e.g., the +/−Y direction) intersecting with the first direction and positioned between the third surface 220A and the fourth surface 220B. Of the plurality of third side surfaces 220C, a third side surface 220C oriented in one direction (e.g., the +X direction) may include an open portion 220E that is at least partially open. In an example embodiment, the plurality of third side surfaces 220C may be formed of rounded surfaces. In an example embodiment, the second housing 220 may include at least one second hole H2 formed on a fourth side surface 220D (e.g., the second lower side surface) oriented in one direction (e.g., the −Y direction), of the plurality of fourth side surfaces 220D. The second hole H2 may be aligned, for example, with the first hole H1.

The electronic device 201 may include a display 261 (e.g., a flexible display or a rollable display) including a screen display area 261A, 261B, 261C. In an example embodiment, the screen display area 261A, 261B, 261C may include a first area 261a positioned on the first surface 210A and the third surface 220A, a second area 261B positioned on a third side surface 220C oriented in one direction (e.g., the −X direction) of the third side surfaces 220C, and a third area 261C positioned on a third side surface 220C oriented in the other direction (e.g., the +X direction) of the third side surfaces 220C and surrounding at least partially the open portion 220E. At least one partial area of the display 261 may be accommodated in the second housing 220. The areas of the display 261 accommodated in the second housing 220 may be viewed to be a substantially translucent material, for example, when viewed in the +Y direction.

In an example embodiment, the second area 261B and the third area 261C of the display 261 may have flexibly curved round surfaces. In various example embodiments, the second area 261B may be at least partially positioned on the first surface 210A and the third surface 220A. In various example embodiments, the third area 261C may be at least partially positioned on the first surface 210A and the third surface 220A. In various example embodiments, the third area 261C may be at least partially positioned on the second surface 210B and the fourth surface 220B.

In an example embodiment, the display 261 may be configured to partially display a screen. For example, the display 261 may display the screen through the first area 261A positioned on the first surface 210A and the third surface 220A, and display the screen through the second area 261B and/or the third area 261C at different points in time from that of the first area 261A.

The electronic device 201 may change in shape between a first shape (e.g., a closed shape, the shape of FIG. 2A) having the screen display area (e.g., the first area 261A, the second area 261B, and the third area 261C) of a first size and a second shape (e.g., an open shape, the shape of FIG. 2B) having the screen display area (e.g., the first area 261A, the second area 261B, and the third area 261C) larger than the first size, when viewed in one direction (e.g., the −Z direction). For example, if the first housing 210 moves relative to the second housing 220 in a first moving direction (e.g., the +X direction) in the first shape, the size of the first area 261A may increase such that the screen display area of the electronic device 201 viewed in one direction (e.g., the −Z direction) may be expanded. For example, if the first housing 210 moves relative to the second housing 220 in a second moving direction (e.g., the −X direction) opposite the first moving direction in the second shape, the size of the first area 261A may decrease. Meanwhile, while the electronic device 201 changes in shape between the first shape and the second shape, the size of the second area 261B and the size of the third area 261C may be substantially constant.

The electronic device 201 may include an actuator 230 configured to move the first housing 210 and the second housing 220 relative to each other. In an example embodiment, the actuator 230 may be positioned in the first housing 210. The actuator 230 may drive the first housing 210 relative to the second housing 220 in the first moving direction (e.g., the +X direction) and the second moving direction (e.g., the −X direction). The actuator 230 may include, for example, an electric motor, a hydraulic motor, and any other motors suitable for generating power. In an example embodiment, the actuator 230 may be positioned in the second housing 220.

The electronic device 201 may include an input module 250 (e.g., the input module 150 of FIG. 1). The input module 250 may be formed, for example, on a third side surface 220C (e.g., the second left side surface) where the open portion 220E is not formed, of the plurality of third side surfaces 220C.

The electronic device 201 may include a first sound output module 255A (e.g., the sound output module 155 of FIG. 1) and a second sound output module 255B (e.g., the sound output module 155 of FIG. 1). In an example embodiment, the first sound output module 255A may be positioned in a first portion (e.g., an upper portion) of the first housing 210, and the second sound output module 255B may be positioned in a second portion (e.g., a lower portion), other than the first portion, of the first housing 210. For example, in the first shape (e.g., the closed shape of the electronic device 201 of FIG. 2A), the first sound output module 255A may be configured to function as a receiver and the second module 255B may be configured to function as a speaker, whereas in the second shape (e.g., the open shape of the electronic device 201 of FIG. 2B), the first sound output module 255A and the second sound output module 255B may be configured to function as a speaker. In various examples, in the second shape, the first sound output module 255A and the second sound output module 255B may output stereo sound in cooperation with each other. In an example embodiment, in the first shape, the second sound output module 255B may be configured to radiate sound through the first hole H1 and the second hole H2 that are substantially aligned with each other, and in the second shape, the second sound output module 255B may be configured to radiate sound through the first hole H1. In an example embodiment, at least one of the first sound output module 255A and the second sound output module 255B may be positioned in the second housing 220. In an example embodiment, the electronic device 201 may include only one of the first sound output module 255A and the second sound output module 255B, or may further include an additional sound output module in addition to the shown sound output modules.

The electronic device 201 may include a haptic module 279 (e.g., the haptic module 179 of FIG. 1). The haptic module 279 may include, for example, a vibrator configured to generate vibrations. In an example embodiment, the haptic module 279 may be positioned in the second housing 220. In various example embodiments, the haptic module 279 may be positioned adjacent to the second sound output module 255B. In an example embodiment, the haptic module 279 may be positioned in the first housing 210.

The electronic device 201 may include a first camera module 280A (e.g., the camera module 180 of FIG. 1) and a second camera module 280B (e.g., the camera module 180 of FIG. 1). The first camera module 280A may be configured to obtain an image of one direction (e.g., the +Z direction) of the electronic device 201, and the second camera module 280B may be configured to obtain an image of the other direction (e.g., the −Z direction) of the electronic device 201. In an example embodiment, the first camera module 280A and the second camera module 280B may be positioned in the second housing 220. In an example embodiment, at least one of the first camera module 280A and the second camera module 280B may be positioned in the first housing 210. In an example embodiment, the electronic device 201 may include only one of the first camera module 280A and the second camera module 280B, or may further include an additional camera module in addition to the shown camera modules.

The electronic device 201 may include a battery 289 (e.g., the battery 189 of FIG. 1). In an example embodiment, the battery 289 may be positioned in the first housing 210. The battery 289 may be at least partially surrounded by, for example, the first sound output module 255A, the first camera module 280A, the second camera module 280B, a first PCB 251, the actuator 230, a third PCB 253, the haptic module 279, and the second sound output module 255B. In an example embodiment, the battery 289 may be positioned in the second housing 220.

The electronic device 201 may include the first PCB 251, a second PCB 252, and the third PCB 253. The first PCB 251, the second PCB 252, and the third PCB 253 may include a plurality of metal layers, and a plurality of dielectrics each positioned between a pair of adjacent metal layers. In an example embodiment, the first PCB 251 may be positioned in the second housing 220. The first PCB 251 may include a first electronic component 288 (e.g., the processor 120 and/or the power management module 188 of FIG. 1). The second PCB 252 may be positioned in the first housing 210. The second PCB 252 may be electrically connected, for example, to the actuator 230. The third PCB 253 may be positioned in the second housing 220. The third PCB 253 may be electrically connected, for example, to the haptic module 279.

The electronic device 201 may include a connecting assembly 290. The connecting assembly 290 may connect the first PCB 251 and the second PCB 252. The connecting assembly 290 may electrically connect, for example, the first electronic component 288 and a second electronic component (e.g., the actuator 230, the battery 289, the first sound output module 255A, and/or the second sound output module 255B). In an example embodiment, the connecting assembly 290 may connect the second electronic component (e.g., the actuator 230) and an electronic component (e.g., the first camera module 280A and/or the second camera module 280B) other than the first electronic component 288.

In an example embodiment, the connecting assembly 290 may be an FPCB, or may include an FPCB.

In an example embodiment, the connecting assembly 290 may include a first portion 291, a second portion 292 connected to the first portion 291 and the first electronic component 288, and a third portion 293 connected to the first portion 291 and the second electronic component (e.g., the actuator 230). Herein, it should be noted that if it is described in the specification disclosure that one component is "connected," "coupled" or "joined" to another component, the former may be directly "connected," "coupled," and "joined" to the latter or "connected", "coupled", and "joined" to the latter via another component. The first portion 291 may be positioned between the second portion 292 and the third portion 293. The second portion 292 and the third portion 293 may be configured to bend relative to the first portion 291 in different directions. For example, while the electronic device 201 changes from the first shape to the second shape, the second portion 292 may be configured to bend relative to the first portion 291 in a first bending direction T1, and the third portion 293 may be configured to bend relative to the first portion 291 in a second bending direction T2 different from the first bending direction T1. For example, the first bending direction T1 and the second bending direction T2 may be opposite directions, when the electronic device 201 is viewed in the −Z direction in FIG. 2E.

In an example embodiment, the number of metal layers of the first portion 291 may be equal to or greater than the number of metal layers of the second portion 292 and/or the number of metal layers of the third portion 293. For example, the first portion 291 may include a plurality of metal layers each with dielectrics positioned on both surfaces thereof, while the second portion 292 and/or the third portion 293 may include at least one metal layer (e.g., an outermost metal layer) with a dielectric positioned on any one surface thereof and a plurality of metal layers each with dielectrics positioned on both surfaces thereof.

In an example embodiment, the first portion 291, the second portion 292, and the third portion 293 may be positioned substantially on the same plane in the first shape. In an example embodiment, the second portion 292 and the third portion 293 may maintain a state of bending relative to the first portion 291 in different directions in the first shape (e.g., the closed shape of the electronic device 201 of FIG. 2A).

The first housing 210 may include a guide 215 configured to guide the first portion 291 between the second portion 292 and the third portion 293 of the connecting assembly 290. The guide 215 may extend along one surface of the first housing 210. The guide 215 may guide the first portion 291 such that the first portion 291 may move along a substantially determined trajectory while an electronic device (e.g., the electronic device 201 of FIGS. 2A and 2B) changes between the first shape (e.g., the closed shape) and the second shape (e.g., the open shape). The guide 215 may include, for example, a structure (e.g., a rib, a projection, a rail, and other guide structures) having a curved profile. In an example embodiment, the guide 215 may be formed in the second housing (e.g., the second housing 220 of FIGS. 2A to 2F).

Referring to FIGS. 2A, 2B, 2C, 2D, 2E, 2F and 2G, the electronic device 201 may include a first cover 211, a first plate 212, a second plate 213, and a support structure 214. The first cover 211, the first plate 212, the second plate 213, and the support structure 214 may form the first housing 210. The electronic device 201 may include a second cover 221 and a third plate 222. The second cover 221 and the third plate 222 may form the second housing 220. The first cover 211 may at least partially surround the first sound output module 255A, the first camera module 280A, the haptic module 279, and the second sound output module 255B. The first plate 212 may at least partially accommodate electronic components (e.g., the actuator 230, the first sound output module 255A, the second sound output module 255B, the first camera module 280A, the second camera module 280B, the first PCB 251, the second PCB 252, the third PCB 253, the connecting assembly 290, the haptic module 279, and other electronic components). The second plate 213 may be positioned between the first plate 212 and the display 261 to support the actuator 230 and the display 261. The support structure 214 may include a base plate 214A configured to flexibly bend, and a plurality of support bars 214B arranged along the base plate 214A to be spaced apart from each other and configured to support the display 261. The second cover 221 may at least partially surround the first cover 211 and be coupled to the first cover 211 such that the first cover 211 may slide relative to the second cover 221. The second cover 221 may be configured to guide the plurality of support bars 214B. The second cover 221 may expose at least a portion (e.g., the second camera module 280B) of the electronic components to the outside of the electronic device 201. The third plate 222 may surround at least a portion of the second cover 221. The third plate 222 may be formed, for example, of a glass material. Meanwhile, the structures of the first housing 210 and the second housing 220 described herein are not limited to the shown example embodiments, and there may be various shapes of structures.

Referring to FIGS. 3A, 3B, 3C and 3D, a connecting assembly 390 (e.g., the connecting assembly 290 of FIGS. 2C to 2G) may include a first portion 391 (e.g., the first portion 291), a second portion 392 (e.g., the second portion 292), and a third portion 393 (e.g., the third portion 293). The first portion 391 may be positioned between the second portion 392 and the third portion 393.

The second portion 392 may be configured to bend relative to the first portion 391 in a first bending direction T1, and the third portion 393 may be configured to bend relative to the first portion 391 in a second bending direction T2 different from the first bending direction T1. In an example embodiment, the first portion 391 may be a bending reference portion when the connecting assembly 390 is viewed in a direction (e.g., the +/−Z direction) intersecting with a direction in which the second portion 392 extends or a direction in which the third portion 393 extends. For example, the first bending direction T1 may be a clockwise or counterclockwise direction with the first portion 391 as a pivot, and the second bending direction T2 may be a counterclockwise or clockwise direction with the first portion 391 as a pivot.

In an example embodiment, the first portion 391, the second portion 392, and the third portion 393 may form an extending shape of the connecting assembly 390. For example, the first portion 391 may extend in a first extending direction (e.g., the +/−Z direction), the second portion 392 may extend in a second extending direction (e.g., the +/−Y direction) intersecting with the first extending direction, and the third portion 393 may extend in a third extending direction (e.g., the +/−Y direction) intersecting with the first extending direction. The second extending direction and the third extending direction may be substantially the same direction (e.g., the +Y direction or the −Y direction) in a first shape (e.g., the shape of the connecting assembly 390 of FIGS. 3A and 3B), or may form a first angle (e.g., about −10 degrees to about +10 degrees). The second extending direction and the third extending direction may form a second angle greater than the first angle in a second shape (e.g., the shape of the connecting assembly 390 of FIGS. 3C and 3D).

In an example embodiment, each of the first portion 391, the second portion 392, and the third portion 393 may at least partially include a rigid portion. The rigid portion may be a portion that does not substantially change in shape, and a flexible portion may be a portion that changes in shape. For example, the rigid portion may be a portion having a first rigidity, and the flexible portion may be a portion having a second rigidity smaller than the first rigidity. In an example embodiment, the first portion 391, the second portion 392, and the third portion 393 may each include at least one rigid portion and at least one flexible portion.

In an example embodiment, the second portion 392 and the third portion 393 may be separated, forming a gap G with each other.

In an example embodiment, the connecting assembly 390 may include a first flexible portion 394A and a second flexible portion 394B. The first flexible portion 394A may be positioned between the first portion 391 and the second portion 392, and the second flexible portion 394B may be positioned between the first portion 391 and the third portion 393. The first flexible portion 394A may cause the second portion 392 to bend relative to the first portion 391 in a first bending direction T1 or a direction −T1 opposite the first bending direction T1. The second flexible portion 394B may cause the third portion 393 to bend relative to the first portion 391 in a second bending direction T2 or a direction −T2 opposite to the second bending direction T2. In an example embodiment, the first flexible portion 394A may extend between the first portion 391 and the second portion 392 in the second extending direction of the second portion 392. The second flexible portion 394B may extend between the first portion 391 and the third portion 393 in the third extending direction of the third portion 393.

In an example embodiment, the connecting assembly 390 may include a first connector portion 395 and a second connector portion 396. The first connector portion 395 may connect the second portion 392 and a first component (e.g., the first electronic component 288 of FIGS. 2C and 2E). For example, the first connector portion 395 may be connected to a PCB (e.g., the first PCB 251) and connected to the first component through the PCB. The second connector portion 396 may connect the third portion 393 and a second component (e.g., the second electronic component, the actuator 230, the battery 289, the first sound output module 255A, and/or the second sound output module 255B of FIGS. 2C and 2E). In an example embodiment, the connecting assembly 390 may not include the first connector portion 395 and the second connector portion 396, and the second portion 392 and the third portion 393 may each include a connector area connected to respective component. In an example embodiment, the PCB (e.g., the second PCB 252) connected by the connecting assembly 390 may extend from the third portion 393 without the second connector portion 396 and be formed as substantially one component. Meanwhile, the type of component connected by the connecting assembly 390 described above is merely an example, and various components other than the described component may be connected by the connecting assembly 390.

In an example embodiment, the first connector portion 395 may include a first connector area 395A configured to be connected to the first component, a first rigid area 395B configured to be connected to the second portion 392, and a flexible area 395C between the first connector area 395A and the first rigid area 395B. In an example embodiment, the first connector area 395A may be formed of a flexible material. In an example embodiment, the first connector area 395A may be formed of a rigid material. In an example embodiment, the first connector portion 395 may include any one of the first rigid area 395B and the first flexible area 395C. In an example embodiment, the first connector portion 395 may include only the first connector area 395A.

In an example embodiment, the second connector portion 396 may include a second connector area 396A configured to be connected to the second component, a second rigid area 396B configured to be connected to the third portion 393, and a second flexible area 396C between the second connector area 396A and the second rigid area 396B. In an example embodiment, the second connector area 396A may be formed of a flexible material. In an example embodiment, the second connector area 396A may be formed of a rigid material.

In an example embodiment, the connecting assembly 390 may include a third flexible portion 397A and a fourth flexible portion 397B. The third flexible portion 397A may be positioned between the second portion 392 and the first connector portion 395, and the fourth flexible portion 397B may be positioned between the third portion 393 and the second connector portion 396. The third flexible portion 397A may cause the second portion 392 to bend relative to the first connector portion 395 in a third bending direction T3 or a direction −T3 opposite the third bending direction T3. The fourth flexible portion 397B may cause the third portion 393 to bend relative to the second connector portion 396 in a fourth bending direction T4 or a direction −T4 opposite to the fourth bending direction T4. In an example embodiment, the third flexible portion 397A may extend between the first rigid area 395B and the second portion 392. The fourth flexible portion 397B may extend between the second rigid area 396B and the third portion 393.

In an example embodiment, the first bending direction T1 and the third bending direction T3 may be substantially opposite directions, and the second bending direction T2 and the fourth bending direction T4 may be substantially opposite directions.

Referring to FIGS. 4A, 4B, 4C, 4D and 4E, an electronic device 401 (e.g., the electronic device 201 of FIGS. 2A to 2G) may include a first housing 410 (e.g., the first housing 210), a second housing 420 (e.g., the second housing 220), a first PCB 451 (e.g., the first PCB 251) positioned in the second housing 420, a second PCB 452 (e.g., the second PCB 252) positioned in the first housing 410, a first electronic component 488 (e.g., the first electronic component 288) positioned in the second housing 420 and on the first PCB 451, a second electronic component 430, 455 (e.g., the actuator 230 and/or the second sound output module 455B) positioned in the first housing 410 and connected to the second PCB 452, a third electronic component 489 (e.g., the battery 289) positioned in the first housing 410, and a connecting assembly 490 (e.g., the connecting assembly 290).

The connecting assembly 490 may connect the first electronic component 488 and the second electronic component 430, 455. The connecting assembly 490 may include a first portion 491-1 (e.g., the first portion 391 of FIGS. 3A to 3D), a second portion 492-1 (e.g., the second portion 392) connected to the first portion 491-1 and the first electronic component 488 and configured to bend relative to the first portion 491-1 in a first bending direction, and a third portion 493-1 (e.g., the third portion 393) connected to the first portion 491-1 and the second electronic component 430, 455 and configured to bend relative to the first portion 491-1 in a second bending direction different from the first bending direction.

In an example embodiment, the connecting assembly 490 may include a first flexible portion 494A-1 (e.g., the first flexible portion 394A) between the first portion 491-1 and the second portion 492-1, and a second flexible portion 494B-1 (e.g., the second flexible portion 394B) between the first portion 491-1 and the third portion 493-1.

In an example embodiment, the connecting assembly 490 may include a first connector portion 495 (e.g., the connector portion 395) connected to the first electronic component 488, and a second connector portion 496 (e.g., the second connector portion 396) connected to the second electronic component 430, 455.

In an example embodiment, the first connector portion 495 may include a first connector area 495A (e.g., the first connector area 395A) configured to be connected to the first electronic component 488, a first flexible area 495B configured to be connected to the second portion 492-1, and a second flexible area 495C between the first connector area 495A and the first flexible area 495B.

In an example embodiment, the second connector portion 496 may include a second connector area 496A (e.g., the second connector area 396A) configured to be connected to the second PCB 452, and a rigid area 496B (e.g., the second rigid area 396B) configured to be connected to the third portion 493-1.

In an example embodiment, the connecting assembly 490 may include a third flexible portion 497A-1 (e.g., the third flexible portion 397A) between the first connector portion 495 and the second portion 492-1, and a fourth flexible portion 497B-1 (e.g., the fourth flexible portion 397B) between the second connector portion 496 and the third portion 493-1. In an example embodiment, the third flexible portion 497A-1 may be connected to the first flexible area 495B. In an example embodiment, the fourth flexible portion 497B-1 may be connected to the rigid area 496B.

The connecting assembly 490 may connect the first electronic component 488 and the third electronic component 489. The connecting assembly 490 may include a fourth portion 491-2 (e.g., the first portion 391 of FIGS. 3A to 3D), a fifth portion 492-2 (e.g., the second portion 392) connected to the first electronic component 488 and the fourth portion 491-2, and a sixth portion 493-2 (e.g., the third portion 393) connected to the third electronic component 489 and the fourth portion 491-2. The multi-connection structure of the connecting assembly 490 may improve the efficiency of the spatial arrangement of the connecting assembly 490 in the first housing 410 and/or the second housing 420 and secure a signal path between adjacent electronic components.

In an example embodiment, the connecting assembly 490 may include a fifth flexible portion 494A-2 (e.g., the first flexible portion 394A) between the fourth portion 491-2 and the fifth portion 492-2, and a sixth flexible portion 494B-2 (e.g., the second flexible portion 394B) between the fourth portion 491-2 and the sixth portion 493-2.

In an example embodiment, the connecting assembly 490 may include a third connector portion 498 connected to the third component 489. The third connector portion 498 may include a third connector area 498A configured to be connected to the third electronic component 489, and a fourth flexible area 498B between the third connector area 498A and the sixth portion 493-2.

In an example embodiment, the connecting assembly 490 may include a seventh flexible portion 497A-2 (e.g., the third flexible portion 397A) between the first connector portion 495 and the fifth portion 492-2, and an eighth flexible portion 497B-2 (e.g., the fourth flexible portion 397B) between the third connector portion 498 and the sixth portion 493-2. In an example embodiment, the seventh flexible portion 497A-2 may be connected to the first flexible area 495B. In an example embodiment, the eighth flexible portion 497B-2 may be connected to the fourth flexible area 498B.

Figure 4A:
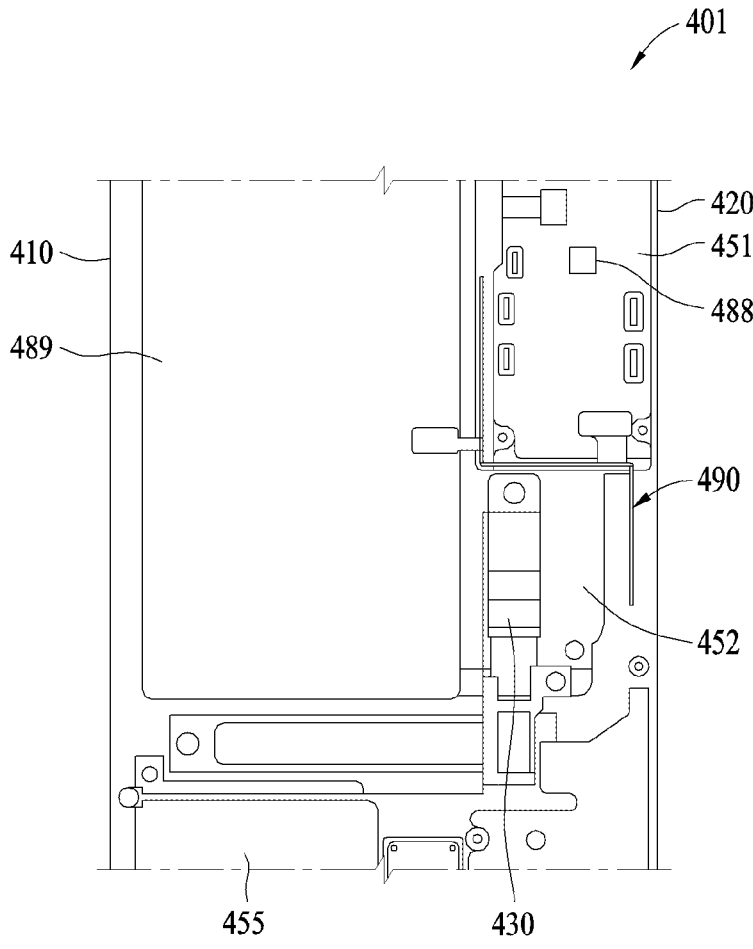
FIG. 4A is a diagram illustrating various components in an electronic device in a closed state according to various embodiments.
Figure 4B:
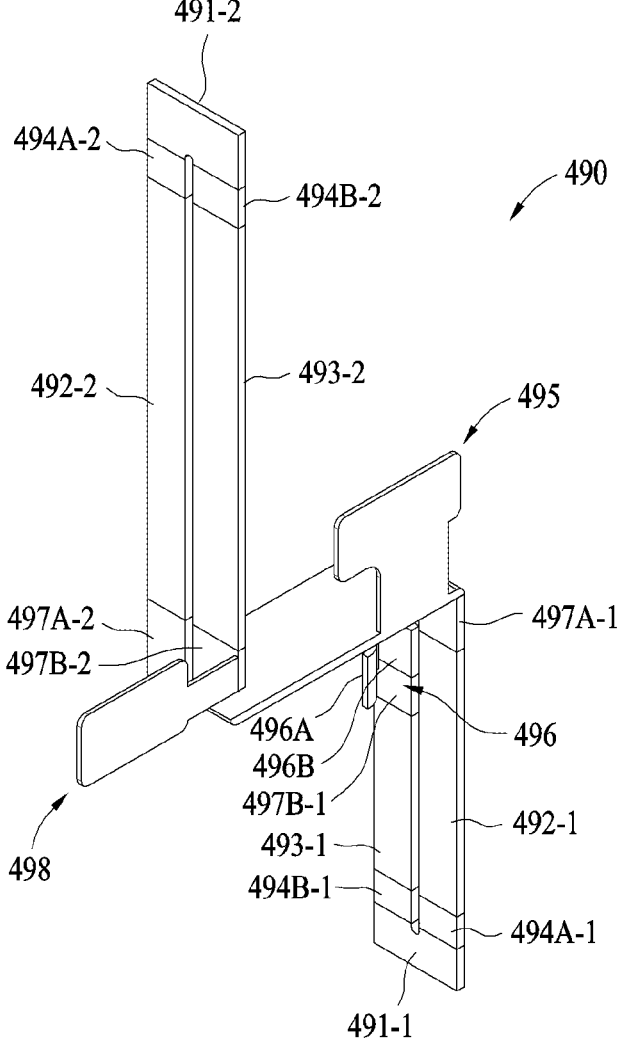
FIG. 4B is a perspective view of an example connecting assembly of FIG. 4A in a first shape according to various embodiments.
Figure 4C:
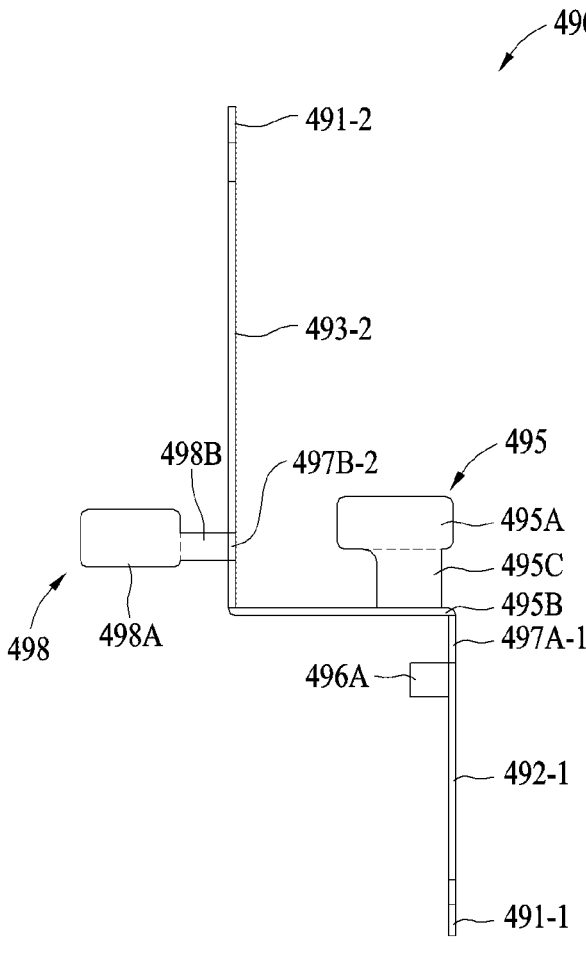
FIG. 4C is a diagram illustrating an example connecting assembly FIG. 4A in a first shape of, viewed in one direction according to various embodiments.
Figure 4D:
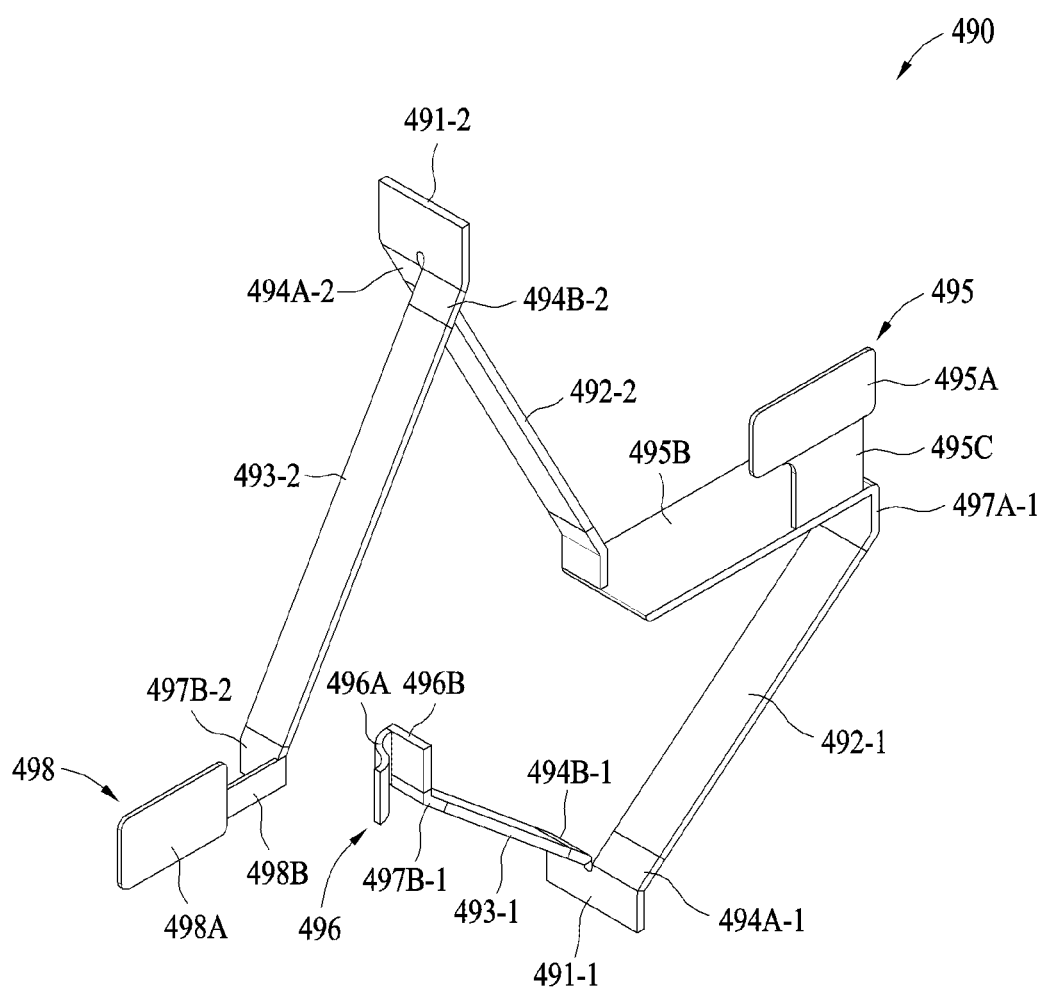
FIG. 4D is a perspective view of an example connecting assembly of FIG. 4A in a second shape according to various embodiments.
Figure 4E:
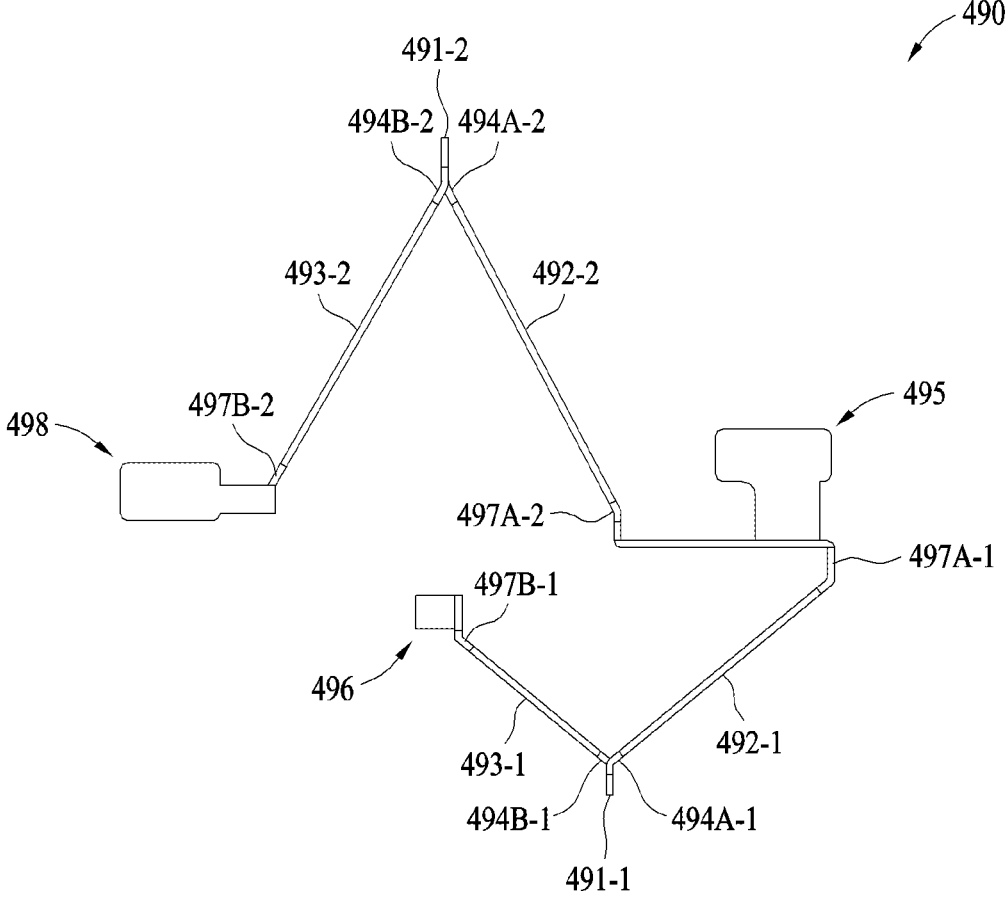
FIG. 4E is a diagram illustrating an example connecting assembly of FIG. 4A in a second shape, viewed in one direction according to various embodiments.

According to the operation of the connecting assembly 490, while the electronic device 401 changes from a first shape (e.g., the shape of the electronic device 201 of FIG. 2A) to a second shape (e.g., the shape of the electronic device 201 of FIG. 2B), the connecting assembly 490 may change from a first shape (e.g., the shape of the connecting assembly 490 of FIGS. 4B and 4C) to a second shape (e.g., the shape of the connecting assembly 490 of FIGS. 4D and 4E). The second portion 492-1 may bend relative to the first portion 491-1 in a first bending direction, the third portion 493-1 may bend relative to the first portion 491-1 in a second bending direction different from the first bending direction (e.g., a direction opposite the first bending direction), the fifth portion 492-2 may bend relative to the fourth portion 491-2 in a third bending direction, and the sixth portion 493-2 may bend relative to the fourth portion 491-2 in a fourth bending direction different from the third bending direction (e.g., a direction opposite the third bending direction). Meanwhile, while the electronic device 401 changes from the second shape to the first shape, the connecting assembly 490 may change from the second shape to the first shape. The second portion 492-1 may bend relative to the first portion 491-1 in the direction opposite the first bending direction, the third portion 493-1 may bend relative to the first portion 491-1 in an opposite direction which to a second bending direction (e.g. a direction opposite to the first bending direction) different from the first bending direction, the fifth portion 492-2 may bend relative to the fourth portion 491-2 in the direction opposite the third bending direction, and the sixth portion 493-2 may bend relative to the fourth portion 491-2 in an opposite direction to a fourth bending direction (e.g. a direction opposite to the third bending direction) different from the third bending direction.

Figure 5A:
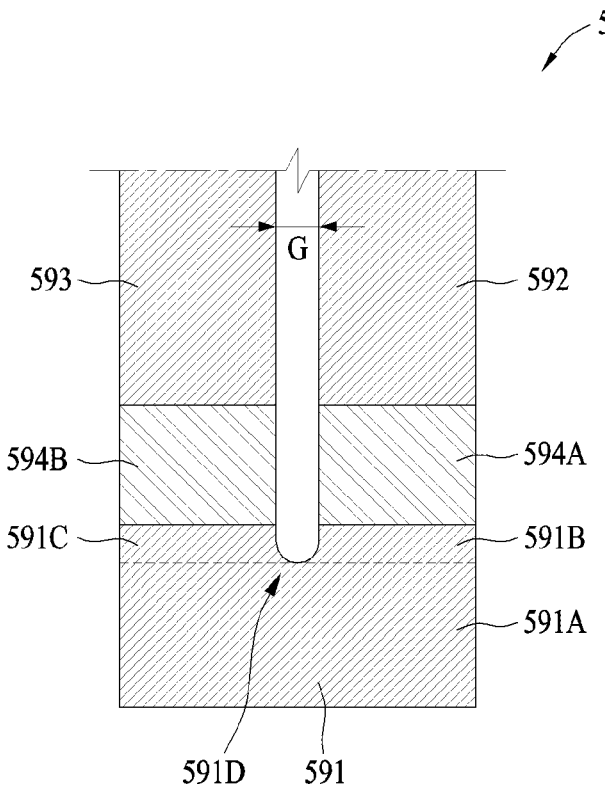
FIG. 5A is a cross-sectional view of an example connecting assembly, viewed in one direction, according to various embodiments.
Figure 5B:
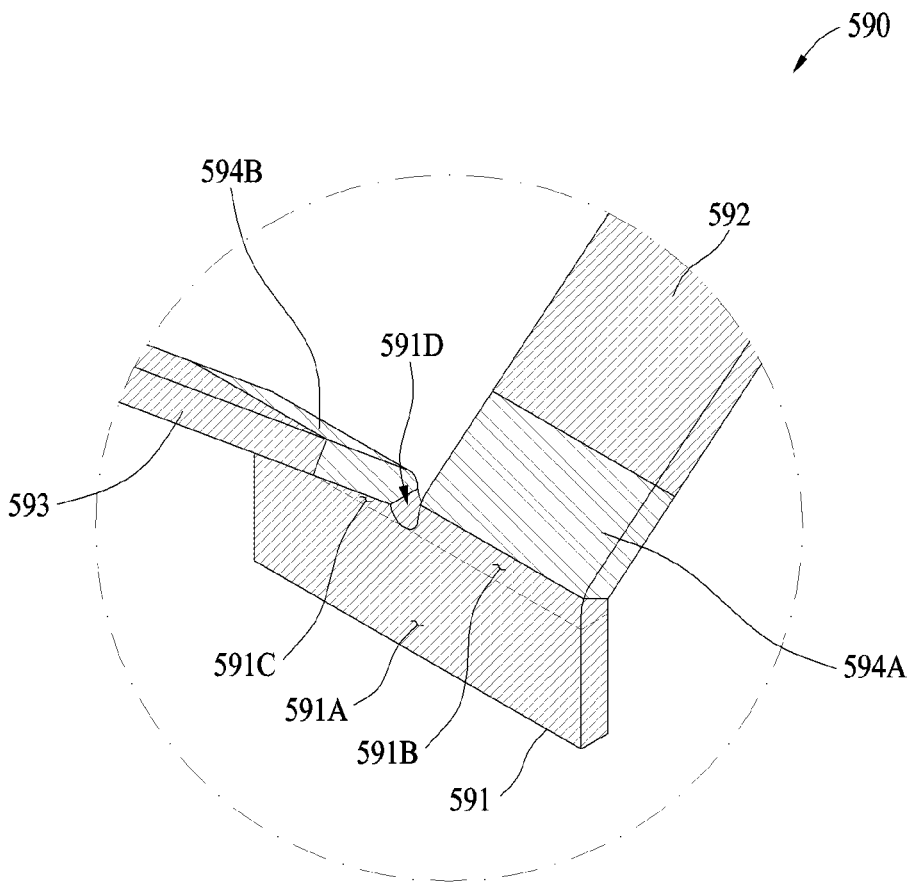
FIG. 5B is a perspective view of a partial structure of an example connecting assembly according to various embodiments.

Referring to FIGS. 5A and 5B, a connecting assembly 590 (e.g., the connecting assembly 390 of FIGS. 3A to 3D) may include a first portion 591 (e.g., the first portion 391), a second portion 592 (e.g., the second portion 392), a third portion 593 (e.g., the third portion 393), a first flexible portion 594A (e.g., the first flexible portion 394A), and a second flexible portion 594B (e.g., the second flexible portion 394B).

In an example embodiment, the first portion 591 may include a first section 591A, a second section 591B between the first section 591A and the second portion 592, and a third section 591C between the first section 591A and the third portion 593. The second section 591B and the third section 591C may each extend from the first section 591A.

In an example embodiment, the second section 591B may be directly connected to the first flexible portion 594A. In an example embodiment, the second section 591B may be directly connected to the second portion 592. In an example embodiment, the third section 591C may be connected to the second flexible portion 594B. In an example embodiment, the third section 591C may be directly connected to the third portion 593.

In an example embodiment, the second section 591B and the third section 591C may be separated, forming a gap G. The separated structures of the second section 591B and the third section 591C may disperse the stress concentrated in a portion of the first portion 591 while the second portion 592 and the third portion 593 repetitively bend relative to the first portion 591.

In an example embodiment, the first section 591A, the second section 591B, and the third section 591C may be formed of a rigid material. In an example embodiment, the first section 591A may be formed of a rigid material, and the second section 591B and the third section 591C may be formed of a flexible material.

In an example embodiment, the second section 591B and the third section 591C may form a notch 591D at a site where the second section 591B and the third section 591C meet the first section 591A. The notch 591D may have, for example, a rounded edge, but is not limited thereto, and may have any one of various polygonal shapes including a square shape.

Figure 6A:
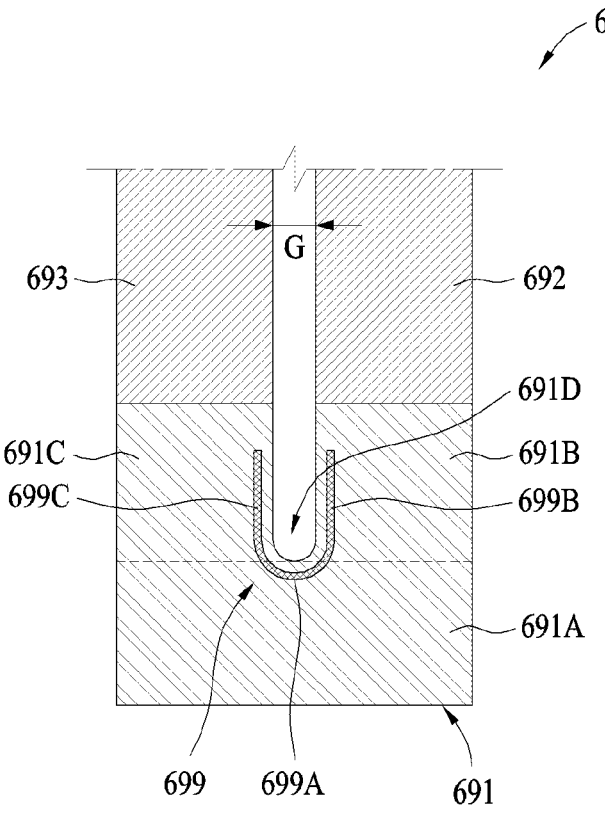
FIG. 6A is a cross-sectional view of an example connecting assembly, viewed in one direction, according to various embodiments.
Figure 6B:
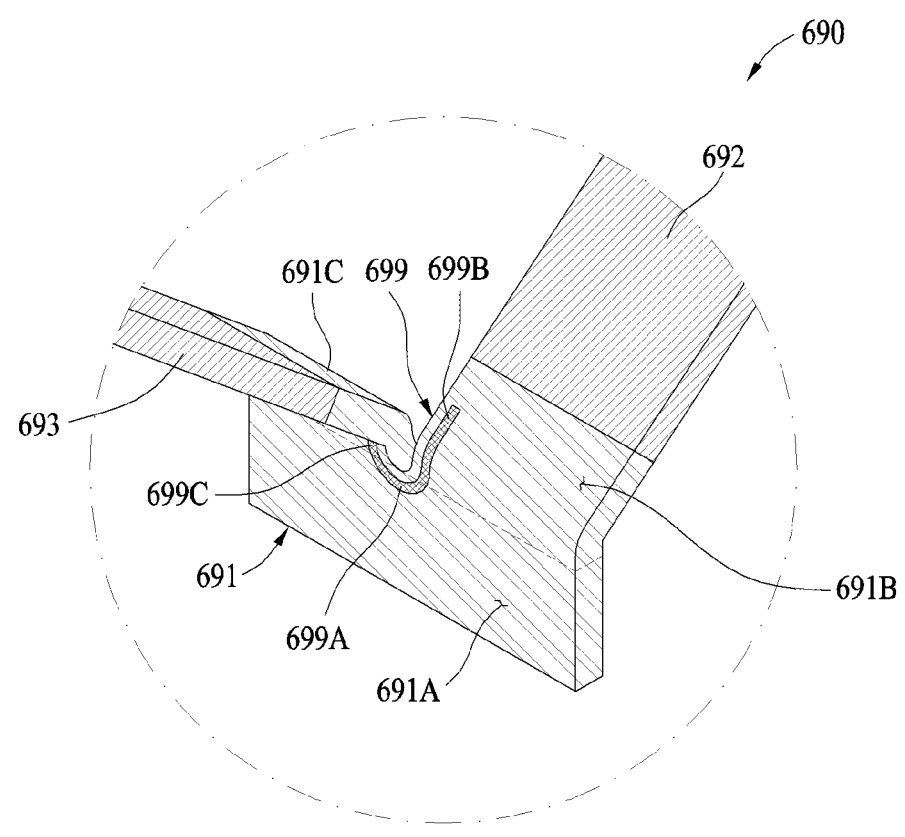
FIG. 6B is a perspective view of a partial structure of an example connecting assembly according to various embodiments.

Referring to FIGS. 6A and 6B, a connecting assembly 690 (e.g., the connecting assembly 590 of FIGS. 5A and 5B) may include a first portion 691 (e.g., the first portion 591), a second portion 692 (e.g., the second portion 592), and a third portion 693 (e.g., the third portion 593). The first portion 691 may include a first section 691A (e.g., the first section 591A), a second section 691B (e.g., the second section 591B) between the first section 691A and the second portion 692, and a third section 691C (e.g., the third section 591C) between the first section 691A and the third portion 693.

In an example embodiment, the second section 691B may be configured to bend relative to the first section 691A in a first bending direction, and the third section 691C may be configured to bend relative to the first section 691A in a second bending direction different from the first bending direction (e.g., a direction opposite the first bending direction).

In an example embodiment, the second section 691B may be directly connected to the second portion 692. In an example embodiment, the third section 691C may be directly connected to the third portion 693.

In an example embodiment, the second section 691B and the third section 691C may be separated, forming a gap G. In an example embodiment, the second section 691B and the third section 691C may form a notch 691D (e.g., the notch 591D) at a site where the second section 691B and the third section 691C meet the first section 691A.

In an example embodiment, the first section 691A, the second section 691B, and the third section 691C may be formed of a flexible material. In an example embodiment, the first section 691A may be formed of a rigid material, and the second section 691B and the third section 691C may be formed of a flexible material.

In an example embodiment, the second portion 692 and the third portion 693 may at least partially include a rigid portion.

In an example embodiment, the connecting assembly 690 may include a reinforcement pattern 699 configured to reinforce the first portion 691. The reinforcement pattern 699 may suppress a change in the shape of the first portion 691 caused by the stress concentrated in a portion of the first portion 691 while the second portion 692 and the third portion 693 repetitively bend relative to the first portion 691.

In an example embodiment, the reinforcement pattern 699 may be formed of a metal material. The metal material may include, for example, copper.

In an example embodiment, the connecting assembly 690 may include a plurality of metal layers that are stacked sequentially, and the reinforcement pattern 699 may be positioned on an outermost metal layer of the plurality of metal layers, or between a pair of adjacent metal layers, or on a metal layer other than the outermost metal layer.

In an example embodiment, the reinforcement pattern 699 may include a first reinforcement portion 699A positioned in the first section 691A, a second reinforcement portion 699B positioned in the second section 691B, and a third reinforcement portion 699C positioned in the third section 691C. The second reinforcement portion 699B may be configured to bend relative to the first reinforcement portion 699A in the first bending direction when the second section 691B bends relative to the first section 691A in the first bending direction. The third reinforcement portion 699C may be configured to bend relative to the first reinforcement portion 699A in the second bending direction when the third section 691C bends relative to the first section 691A in the second bending direction different from the first bending direction.

In an example embodiment, the first reinforcement portion 699A, the second reinforcement portion 699B, and the third reinforcement portion 699C may be seamlessly integrally connected.

In an example embodiment, the first reinforcement 699A, the second reinforcement portion 699B, and the third reinforcement portion 699C may at least partially surround the notch 691D. For example, the first reinforcement portion 699A may be formed in the first section 691A along the edge of the notch 691D. The second reinforcement portion 699B may be at least partially formed in the second section 691B along the edge of the second section 691B that faces the notch 691D. The third reinforcement portion 699C may be at least partially formed in the third section 691C along the edge of the third section 691C that faces the notch 691D.

In an example embodiment, the reinforcement pattern 699 may include at least one of the first reinforcement portion 699A, the second reinforcement portion 699B, and the third reinforcement portion 699C. For example, the reinforcement pattern 699 may include only one of the first reinforcement portion 699A, the second reinforcement portion 699B, and the third reinforcement portion 699C, or include the first reinforcement portion 699A and the second reinforcement portion 699B, or include the second reinforcement portion 699B and the third reinforcement portion 699C, or include the first reinforcement portion 699A and the third reinforcement portion 699C.

Figure 7A:
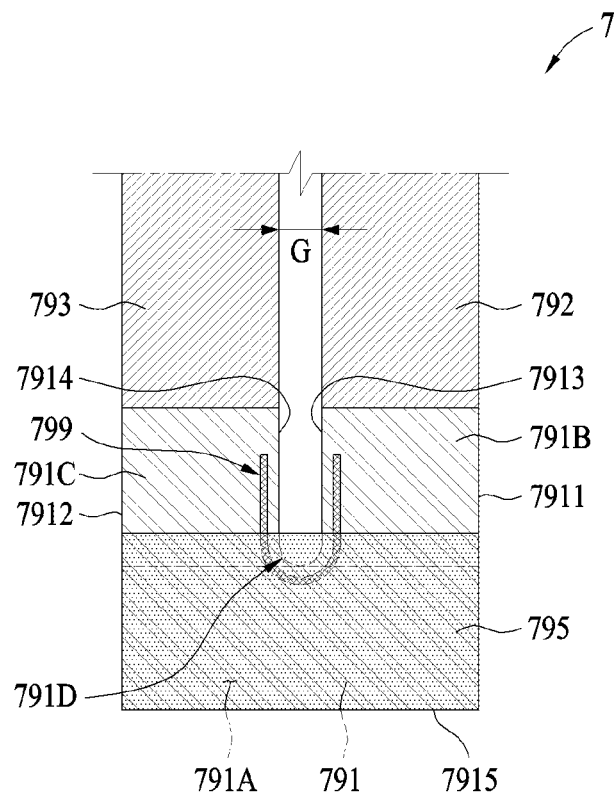
FIG. 7A is a cross-sectional view of an example connecting assembly, viewed in one direction, according to various embodiments.
Figure 7B:
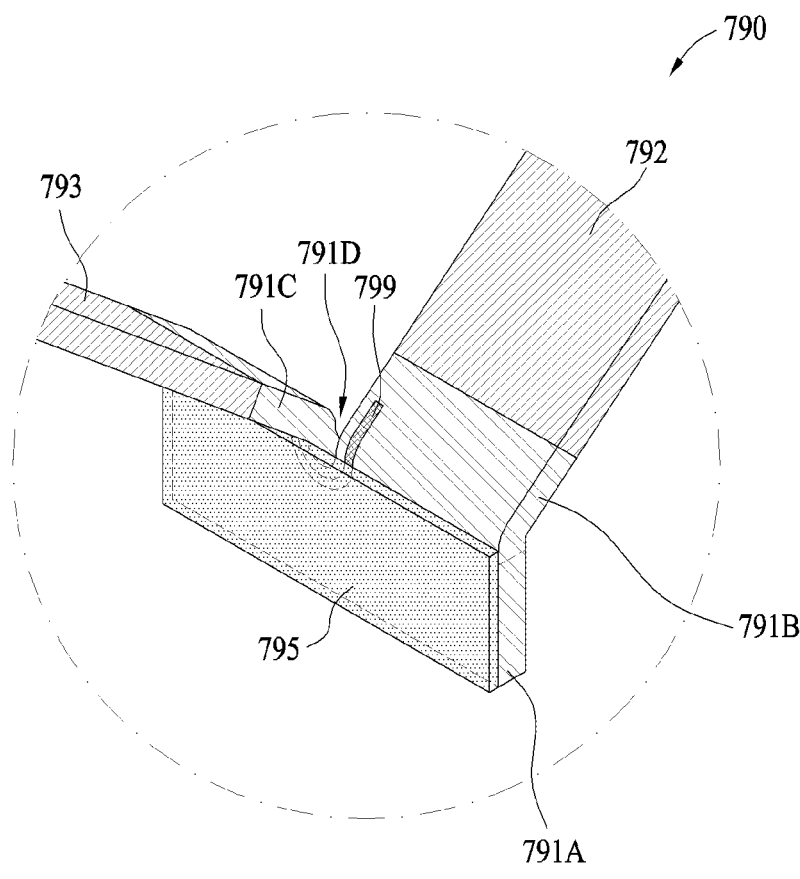
FIG. 7B is a perspective view of a partial structure of an example connecting assembly according to various embodiments.

Referring to FIGS. 7A and 7B, a connecting assembly 790 (e.g., the connecting assembly 690 of FIGS. 6A and 6B) may include a first portion 791 (e.g., the first portion 691), a second portion 792 (e.g., the second portion 692), a third portion 793 (e.g., the third portion 693), and a reinforcement pattern 799 (e.g., the reinforcement pattern 699). The first portion 791 may include a first section 791A (e.g., the first section 691A), a second section 791B (e.g., the second section 691B), a third section 791C (e.g., the third section 691C), and a notch 791D (e.g., the notch 691D). The first portion 791 may include a first outer edge 7911 connected to the second portion 792, a first inner edge 7913 connected to the second portion 792 and opposite the first outer edge 7911, a second outer edge 7912 connected to the third portion 793, a second inner edge 7914 connected to the third portion 793 and opposite the second outer edge 7912 and facing the first inner edge 7913, and a third outer edge 7915 between the first outer edge 7911 and the second outer edge 7912. The second portion 792 and the third portion 793 may be separated from each other to form a gap G. The second section 791B and the third section 791C may be separated from each other to form a gap G.

In an example embodiment, the connecting assembly 790 may include a reinforcement plate 795 configured to reinforce at least a portion of the first portion 791. The reinforcement plate 795 may reinforce the first portion 791 while the second portion 792 and the third portion 793 bends relative to the first portion 791.

In an example embodiment, the reinforcement plate 795 may substantially cover the first section 791A, and at least partially cover the second section 791B and the third section 791C. In an example embodiment, the reinforcement plate 795 may extend across the first section 791A and from the third outer edge 7915 between the first outer edge 7911 and the second outer edge 7912 and be positioned on the first portion 791. In an example embodiment, the reinforcement plate 795 may at least partially cover the notch 791D. In an example embodiment, the reinforcement plate 795 may be at least partially positioned on the first inner edge 7913 and the second inner edge 7914. In an example embodiment, the reinforcement plate 795 may overlap at least a portion of the reinforcement pattern 799.

In an example embodiment, the connecting assembly 790 may include at least one of the reinforcement pattern 799 and the reinforcement plate 795. In various example embodiments, the reinforcement pattern 799 and the reinforcement plate 795 may reinforce the first portion 791 in cooperation with each other.

Figure 8A:
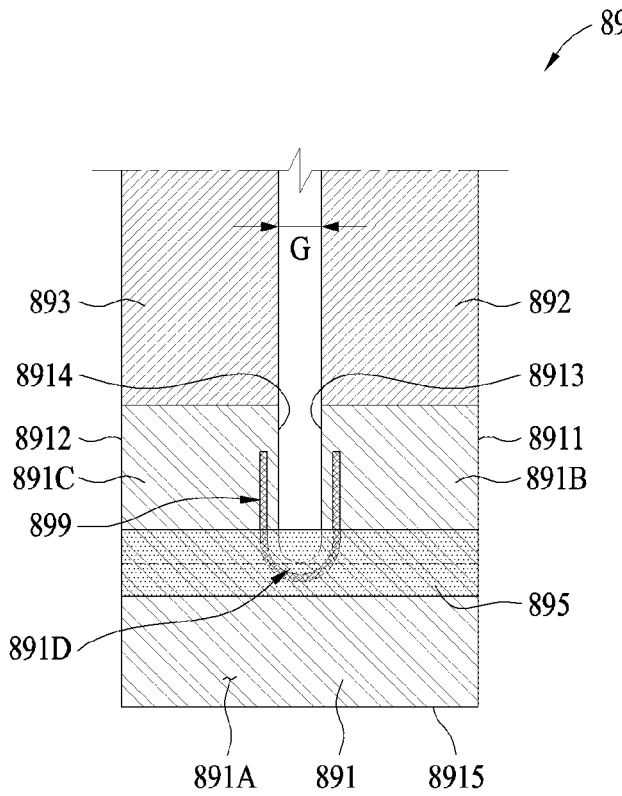
FIG. 8A is a cross-sectional view of an example connecting assembly, viewed in one direction, according to various embodiments.
Figure 8B:
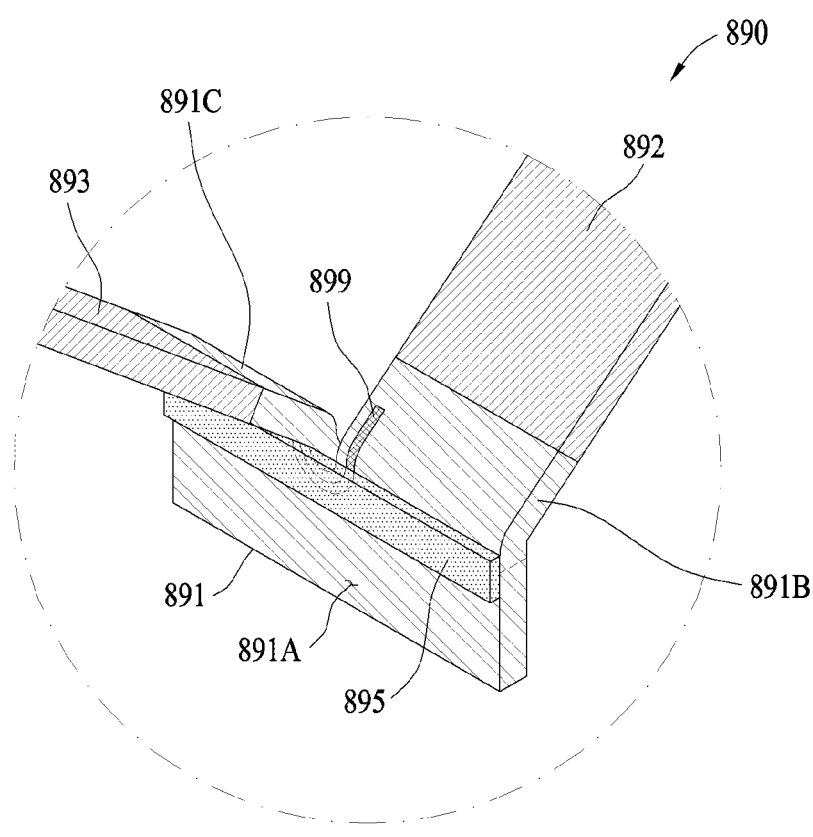
FIG. 8B is a perspective view of a partial structure of an example connecting assembly according to various embodiments.

Referring to FIGS. 8A and 8B, a connecting assembly 890 (e.g., the connecting assembly 790 of FIGS. 7A and 7B) may include a first portion 891 (e.g., the first portion 791), a second portion 892 (e.g., the second portion 792), a third portion 893 (e.g., the third portion 793), a reinforcement plate 895 (e.g., the reinforcement plate 795), and a reinforcement pattern 899 (e.g., the reinforcement pattern 799). The first portion 891 may include a first section 891A (e.g., the first section 791A), a second section 891B (e.g., the second section 791B), a third section 891C (e.g., the third section 791C), and a notch 891D (e.g., the notch 791D). The first portion 891 may include a first outer edge 8911 (e.g., the first outer edge 7911), a second outer edge 8912 (e.g., the second outer edge 7912), a first inner edge 8913 (e.g., the first inner edge 7913), a second inner edge 8914 (e.g., the second inner edge 7914), and a third outer edge 8915 (e.g., the third outer edge 7915). The second portion 892 and the third portion 893 may be separated from each other to form a gap G. The second section 891B and the third section (891C) may be separated from each other to form a gap G.

In an example embodiment, the reinforcement plate 895 may be positioned on the first portion 891 across the first section 891A between the first outer edge 8911 and the second outer edge 8912. In an example embodiment, the reinforcement plate 895 may not be positioned on the third outer edge 8915. In an example embodiment, the reinforcement plate 895 may at least partially cover the notch 891D. In an example embodiment, the reinforcement plate 895 may be at least partially positioned on the first inner edge 8913 and the second inner edge 8914. In an example embodiment, the reinforcement plate 895 may overlap at least a portion of the reinforcement pattern 899.

In an example embodiment, the connecting assembly 890 may include at least one of the reinforcement pattern 899 and the reinforcement plate 895. In various example embodiments, the reinforcement pattern 899 and the reinforcement plate 895 may reinforce the first portion 891 in cooperation with each other.

Figure 9A:
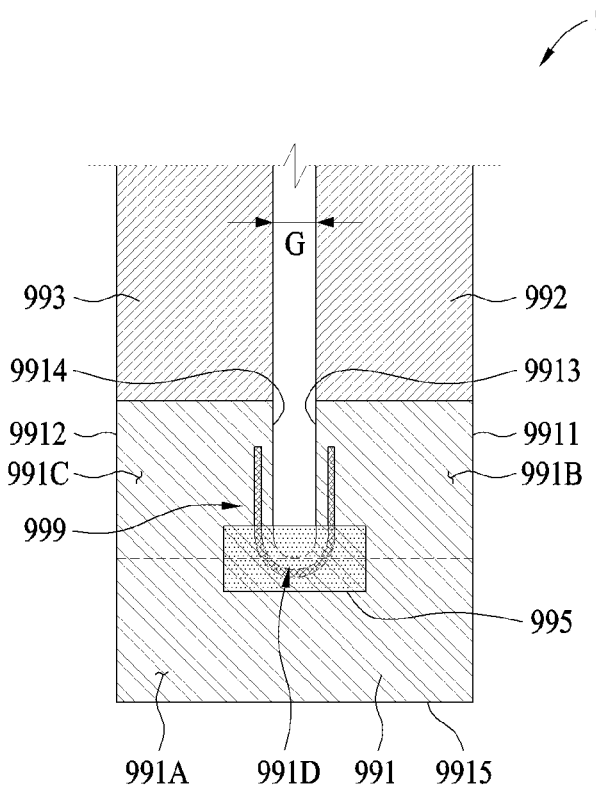
FIG. 9A is a cross-sectional view of an example connecting assembly, viewed in one direction, according to various embodiments.
Figure 9B:
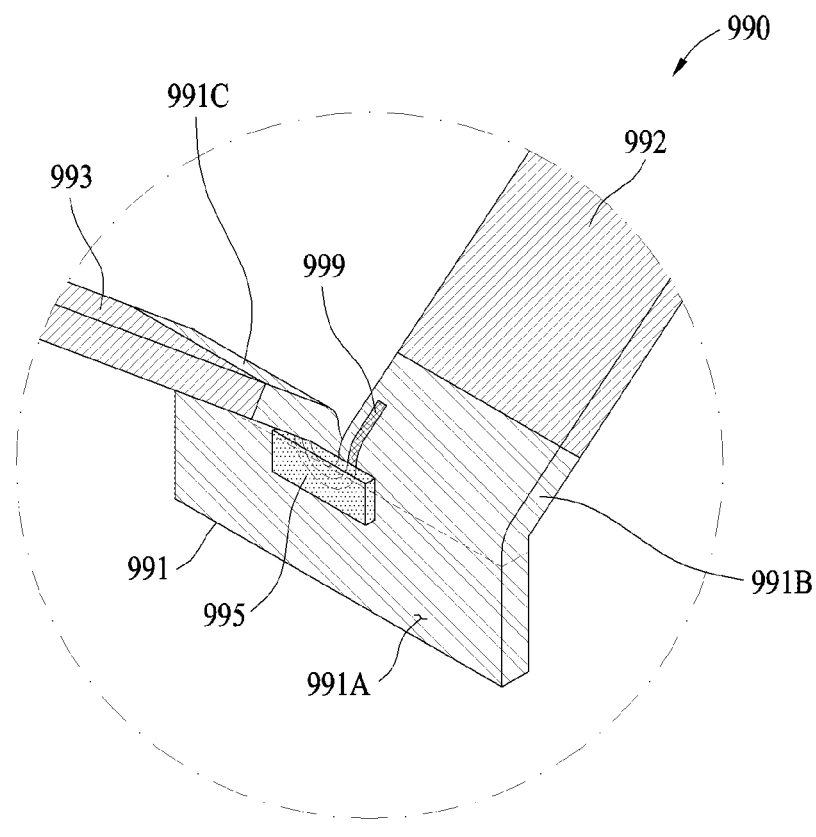
FIG. 9B is a perspective view of a partial structure of an example connecting assembly according to various embodiments.

Referring to FIGS. 9A and 9B, a connecting assembly 990 (e.g., the connecting assembly 790 of FIGS. 7A and 7B) may include a first portion 991 (e.g., the first portion 791), a second portion 992 (e.g., the second portion 792), a third portion 993 (e.g., the third portion 793), a reinforcement plate 995 (e.g., the reinforcement plate 795), and a reinforcement pattern 999 (e.g., the reinforcement pattern 799). The first portion 991 may include a first section 991A (e.g., the first section 791A), a second section 991B (e.g., the second section 791B), a third section 991C (e.g., the third section 791C), and a notch 991D (e.g., the notch 791D). The first portion 991 may include a first outer edge 9911 (e.g., the first outer edge 7911), a second outer edge 9912 (e.g., the second outer edge 7912), a first inner edge 9913 (e.g., the first inner edge 7913), a second inner edge 9914 (e.g., the second inner edge 7914), and a third outer edge 9915 (e.g., the third outer edge 7915). The second portion 992 and the third portion 993 may be separated from each other to form a gap G. The second section 991B and the third section 991C may be separated from each other to form a gap G.

In an example embodiment, the reinforcement plate 995 may be positioned on a portion of the first section 991A, a portion of the second section 991B, and a portion of the third section 991C. In an example embodiment, the reinforcement plate 995 may be positioned on the first inner edge 9913 and the second inner edge 9914 to cover the notch 991D.

In an example embodiment, the reinforcement plate 995 may not be positioned on the first outer edge 9911, the second outer edge 9912, and the third outer edge 9915. In an example embodiment, the reinforcement plate 995 may overlap at least a portion of the reinforcement pattern 999.

In an example embodiment, the connecting assembly 990 may include at least one of the reinforcement pattern 999 and the reinforcement plate 995. In various example embodiments, the reinforcement pattern 999 and the reinforcement plate 995 may reinforce the first portion 991 in cooperation with each other.

Figure 10A:
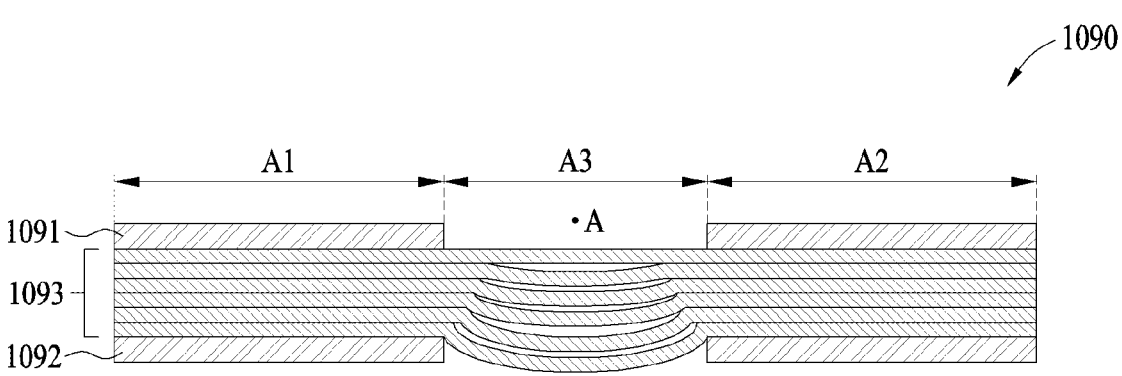
FIG. 10A is a diagram illustrating a stacked structure of a connecting assembly in a first shape according to various embodiments.
Figure 10B:
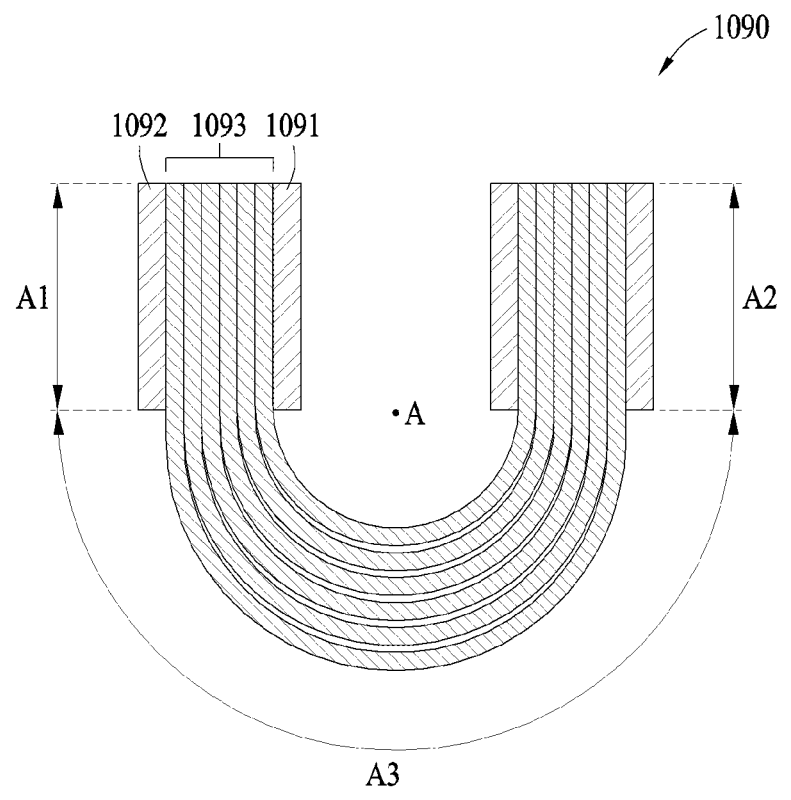
FIG. 10B is a diagram illustrating a stacked structure of a connecting assembly in a second shape according to various embodiments.

Referring to FIGS. 10A and 10B, a connecting assembly 1090 (e.g., the connecting assembly 390 of FIGS. 3A to 3D) may include a plurality of layers 1091, 1092, and 1093. For example, the plurality of layers 1091, 1092, and 1093 may form an FPCB including a plurality of metal layers (e.g., layers of a copper material) and at least one dielectric layer. Of the plurality of layers 1091, 1092, and 1093, the first outermost layer 1091 and the second outermost layer 1092, positioned on the outermost side, may be metal layers each with a dielectric positioned on only one surface thereof. A plurality of intermediate layers 1093 may be positioned between the first outermost layer 1091 and the second outermost layer 1092.

In an example embodiment, the connecting assembly 1090 may include a first area A1 (e.g., the first portion 391) including the first outermost layer 1091, the second outermost layer 1092, and the plurality of intermediate layers 1093, a second area A2 (e.g., the second portion 392 or the third portion 393) spaced apart from the first area A1 and including the first outermost layer 1091, the second outermost layer 1092, and the plurality of intermediate layers 1093, and a third area A3 (e.g., the first flexible portion 394A or the second flexible portion 394B) positioned between the first area A1 and the second area A2 and including the plurality of intermediate layers 1093. In an example embodiment, the third area A3 may not include the first outermost layer 1091 and the second outermost wall layer 1092.

In an example embodiment, the plurality of intermediate layers 1093 of the third area A3 may be configured to cause the first area A1 and the second area A2 to bend relative to each other about a bending point A.

In an example embodiment, radiuses of curvature of the plurality of intermediate layers 1093 may sequentially increase in a direction from the first outermost layer 1091 to the second outermost layer 1092 (e.g., a downward direction in FIG. 10A) in the first area A1 and/or the second area A2. For example, the rate of increase in the radiuses of curvature may be linear.

In an example embodiment, lengths of the plurality of intermediate layers 1093 in the third area A3 may sequentially increase in the direction from the first outermost layer 1091 to the second outermost layer 1092 (e.g., the downward direction in FIG. 10A) in the first area A1 and/or the second area A2. For example, the rate of increase in the lengths may be linear.

According to various example embodiments, an electronic device may include: a first housing and a second housing, wherein the second housing may include a first electronic component, the first housing may include a second electronic component, and the first housing may be configured to move relative to the second housing in a first moving direction and a second moving direction opposite the first moving direction; a display including a screen display area having a first size based on the first housing moving in the first moving direction and has a second size smaller than the first size based on the first housing moving in the second moving direction, and a connecting assembly comprising a printed circuit board (e.g., a flexible printed circuit board) including a first portion, a second portion connected to the first portion and the first electronic component and configured to bend relative to the first portion in a first bending direction, and a third portion connected to the first portion and the second electronic component and configured to bend relative to the first portion in a second bending direction different from the first bending direction.

In an example embodiment, the connecting assembly may further include: a first flexible portion between the first portion and the second portion, and a second flexible portion between the first portion and the third portion.

In an example embodiment, the first portion may include a first rigid portion connected to the first flexible portion and the second flexible portion, the second portion may include a second rigid portion connected to the first flexible portion, and the third portion may include a third rigid portion connected to the second flexible portion.

In an example embodiment, the connecting assembly may further include: a third flexible portion between the first electronic component and the second rigid portion, and a fourth flexible portion between the second electronic component 230, and the third rigid portion.

In an example embodiment, the first portion may extend in a first extending direction, the second portion may extend in a second extending direction intersecting with the first extending direction, and the third portion may extend in a third extending direction intersecting with the first extending direction.

In an example embodiment, the first portion may include: a first section, a second section extending from the first section and positioned between the first section and the second portion, and a third section extending from the first section, forming a gap with the second section, and positioned between the first section and the third portion.

In an example embodiment, the second portion and the third portion may be separated from each other.

In an example embodiment, the first portion may be formed of a flexible material, and the connecting assembly may further include a reinforcement pattern positioned in the first portion.

In an example embodiment, the first portion may include: a first section, a second section extending from the first section and positioned between the first section and the second portion, and a third section extending from the first section, forming a gap with the second section, and positioned between the first section and the third portion, wherein the reinforcement pattern may be formed in at least one of the first section, the second section, and the third section while at least partially surrounding the gap.

In an example embodiment, the first portion may be formed of a flexible material, and the connecting assembly may further include a reinforcement plate positioned in the first portion.

In an example embodiment, the first portion may include a first outer edge connected to the second portion, a second outer edge connected to the third portion, and a third outer edge between the first outer edge and the second outer edge, and the reinforcement plate may be positioned on the first outer edge, the second outer edge, and the third outer edge.

In an example embodiment, the first portion may include a first outer edge connected to the second portion, a second outer edge connected to the third portion, and a third outer edge between the first outer edge and the second outer edge, and the reinforcement plate may be positioned on the first outer edge and the second outer edge and may not be positioned on the third outer edge.

In an example embodiment, the first portion may include a first outer edge connected to the second portion, a second outer edge connected to the third portion, and a third outer edge between the first outer edge and the second outer edge, and the reinforcement plate may not be positioned on the first outer edge, the second outer edge, and the third outer edge.

In an example embodiment, the electronic device may further include a guide formed in at least one of the first housing and the second housing and configured to guide the first portion.

In an example embodiment, the connecting assembly may include: a first outermost layer, a second outermost layer opposite the first outermost layer, and a plurality of intermediate layers between the first outermost layer and the second outermost layer, wherein the connecting assembly may further include a first flexible portion between the first portion and the second portion, and in the first flexible portion, a length of an intermediate layer adjacent to the first outermost layer may be shorter than a length of an intermediate layer adjacent to the second outermost layer.

In an example embodiment, the first housing may further include: a third electronic component, wherein the connecting assembly may include a fourth portion, a fifth portion connected to the fourth portion and the first electronic component and configured to bend relative to the fourth portion in a third bending direction, and a sixth portion connected to the fourth portion and the third electronic component and configured to bend relative to the fourth portion in a fourth bending direction different from the third bending direction.

According to various example embodiments, a printed circuit board (PCB) may include: a first portion, a second portion connected to the first portion and configured to bend relative to the first portion in a first bending direction, and a third portion connected to the first portion and configured to bend relative to the first portion in a second bending direction different from the first bending direction.

In an example embodiment, the PCB may further include: a first flexible portion between the first portion and the second portion, and a second flexible portion between the first portion and the third portion.

In an example embodiment, the first portion may include a first rigid portion connected to the first flexible portion and the second flexible portion, the second portion may include a second rigid portion connected to the first flexible portion, and the third portion may include a third rigid portion connected to the second flexible portion.

In an example embodiment, the PCB may further include: a third flexible portion connected to the second rigid portion, and a fourth flexible portion connected to the third rigid portion.

In an example embodiment, in an electronic device including a first housing and a second housing, wherein the second housing may include a first electronic component, the first housing may include a second electronic component, and the first housing may be configured to move relative to the second housing in a first moving direction and a second moving direction opposite the first moving direction, the second portion may be configured to be connected to the first electronic component, and the third portion may be configured to be connected to the second electronic component.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device, comprising:
a first housing including a first printed circuit board (PCB);
a second housing configured to slide relative to the first housing in a first sliding direction and a second sliding direction opposite the first sliding direction and including a second printed circuit board (PCB);
a flexible display comprising a display area configured to expand or reduce based on a sliding direction of the second housing relative to the first housing; and
a flexible printed circuit board (FPCB) configured to electrically connect the first PCB and the second PCB and to expand based on the second housing sliding in the second direction or to contract based on the second housing sliding in the first direction, the FPCB including:
a first portion having a rigid material and defining a bending reference,
a second portion connected to the first portion and the first PCB, and configured to bend relative to the first portion in a first bending direction via a first flexible portion between the second portion and the first portion, and
a third portion connected to the first portion and the second PCB, and configured to bend relative to the first portion in a second bending direction opposite to the first bending direction via a second flexible portion between the third portion and the first portion,
wherein the first flexible portion and the second flexible portion are positioned on opposite sides of the bending reference defining independent flexible joints so that the second portion and the third portion are bendable about the first portion in mutually opposite directions while maintaining electrical continuity through the first portion,
wherein the second portion and the third portion extend from the first portion in the same extending direction, and
wherein based on the second housing sliding in the first sliding direction, the second portion and the third portion move closer to each other, and based on the second housing sliding in the second sliding direction, the second portion and the third portion move away from each other.

2. The electronic device of claim 1, wherein the second portion and the third portion form a first angle when the PCB is in a first configuration, and the second portion and the third portion form a second angle less than the first angle when the PCB is in a second configuration.

3. The electronic device of claim 1, wherein the FPCB further comprises:
a third flexible portion between the first PCB and the second portion; and
a fourth flexible portion between the second PCB and the third portion.

4. The electronic device of claim 1, wherein the first portion extends in a first extending direction, the second portion extends in a second extending direction intersecting with the first extending direction, and the third portion extends in a third extending direction intersecting with the first extending direction.

5. The electronic device of claim 1, wherein the first portion comprises:
a first section;
a second section extending from the first section and positioned between the first section and the second portion; and
a third section extending from the first section, forming a gap with the second section, and positioned between the first section and the third portion.

6. The electronic device of claim 1, wherein the second portion and the third portion are separated from each other.

7. The electronic device of claim 1, wherein the first portion comprises a flexible material, and the FPCB further comprises a reinforcement pattern positioned in the first portion.

8. The electronic device of claim 7, wherein the first portion comprises:
a first section;
a second section extending from the first section and positioned between the first section and the second portion; and
a third section extending from the first section, forming a gap with the second section, and positioned between the first section and the third portion,
wherein the reinforcement pattern is formed in at least one of the first section, the second section, and the third section and at least partially surrounding the gap.

9. The electronic device of claim 1, wherein the first portion comprises a flexible material, and the FPCB further comprises a reinforcement plate positioned in the first portion.

10. The electronic device of claim 9, wherein the first portion comprises a first outer edge connected to the second portion, a second outer edge connected to the third portion, and a third outer edge between the first outer edge and the second outer edge, and
the reinforcement plate is positioned on the first outer edge, the second outer edge, and the third outer edge.

11. The electronic device of claim 9, wherein the first portion comprises a first outer edge connected to the second portion, a second outer edge connected to the third portion, and a third outer edge between the first outer edge and the second outer edge, and
the reinforcement plate is positioned on the first outer edge and the second outer edge and is not positioned on the third outer edge.

12. The electronic device of claim 9, wherein the first portion comprises a first outer edge connected to the second portion, a second outer edge connected to the third portion, and a third outer edge between the first outer edge and the second outer edge, and
the reinforcement plate is not positioned on any of the first outer edge, the second outer edge, and the third outer edge.

13. The electronic device of claim 1, further comprising:

a guide disposed in at least one of the first housing and the second housing and configured to guide the first portion.

14. The electronic device of claim 1, wherein the FPCB comprises: a first outermost layer, a second outermost layer opposite the first outermost layer, and a plurality of intermediate layers between the first outermost layer and the second outermost layer, and in the first flexible portion, a length of an intermediate layer adjacent to the first outermost layer is shorter than a length of an intermediate layer adjacent to the second outermost layer.

15. The electronic device of claim 1, wherein the first housing or the second housing further comprises a third printed circuit board (PCB), wherein the FPCB further comprises:

a fourth portion having a rigid material, a fifth portion connected to the fourth portion and the first PCB, having a rigid material, and configured to bend relative to the fourth portion in a third bending direction, a third flexible portion between the fourth portion and the fifth portion, a sixth portion connected to the fourth portion and the third PCB, having a rigid material, and configured to bend relative to the fourth portion in a fourth bending direction different from the third bending direction, and a fourth flexible portion between the fourth portion and the sixth portion.

16. A flexible printed circuit board (FPCB), comprising:

a first portion having a rigid material and defining a bending reference;

a second portion connected to the first portion, and configured to bend relative to the first portion in a first bending direction via a first flexible portion between the second portion and the first portion; and a third portion connected to the first portion, and configured to bend relative to the first portion in a second bending direction opposite to the first bending direction via a second flexible portion between the third portion and the first portion, wherein the first flexible portion and the second flexible portion are positioned on opposite sides of the bending reference defining independent flexible joints so that the second portion and the third portion are bendable about the first portion in mutually opposite directions while maintaining electrical continuity through the first portion, wherein the second portion and the third portion extend from the first portion in the same extending direction, wherein in a first configuration, the second portion and the third portion move closer to each other, and in a second configuration, the second portion and the third portion move away from each other, and wherein the second portion and the third portion form a first angle when the FPCB is in the first configuration, and the second portion and the third portion form a second angle less than the first angle when the FPCB is in the second configuration.

17. The FPCB of claim 16, further comprising:

a fourth portion having a rigid material;

a fifth portion connected to the fourth portion, having a rigid material, and configured to bend relative to the fourth portion in a third bending direction;

a third flexible portion between the fourth portion and the fifth portion;

a sixth portion connected to the fourth portion, having a rigid material, and configured to bend relative to the fourth portion in a fourth bending direction different from the third bending direction; and a fourth flexible portion between the fourth portion and the sixth portion.

* * * * *